US010937787B2

(12) United States Patent
Noh et al.

(10) Patent No.: US 10,937,787 B2
(45) Date of Patent: Mar. 2, 2021

(54) SEMICONDUCTOR DEVICES HAVING DIFFERENT NUMBERS OF STACKED CHANNELS IN DIFFERENT REGIONS AND METHODS OF MANUFACTURING THE SAME

(71) Applicant: SAMSUNG ELECTRONICS CO., LTD., Suwon-si (KR)

(72) Inventors: Chang-Woo Noh, Hwaseong-si (KR); Jae-Hyeoung Ma, Seongnam-si (KR); Dong-Il Bae, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 26 days.

(21) Appl. No.: 16/354,505

(22) Filed: Mar. 15, 2019

(65) Prior Publication Data
US 2020/0006333 A1  Jan. 2, 2020

(30) Foreign Application Priority Data

Jun. 29, 2018  (KR) .................. 10-2018-0075616

(51) Int. Cl.
*H01L 27/088*  (2006.01)
*H01L 29/165*  (2006.01)
(Continued)

(52) U.S. Cl.
CPC .... *H01L 27/0886* (2013.01); *H01L 21/02532* (2013.01); *H01L 21/3086* (2013.01);
(Continued)

(58) Field of Classification Search
CPC ......... H01L 21/02529; H01L 21/02532; H01L 21/0262; H01L 21/02636; H01L 21/3086;
(Continued)

(56) References Cited

U.S. PATENT DOCUMENTS 7,229,884 B2   6/2007  Park
7,309,635 B2  12/2007  Park
(Continued)

FOREIGN PATENT DOCUMENTS

KR   10-2006-0046879   5/2006
KR       10-0625177   9/2006

*Primary Examiner* — Duy T Nguyen
(74) *Attorney, Agent, or Firm* — F. Chau & Associates, LLC

(57) ABSTRACT

A semiconductor device may include first channels on a first region of a substrate and spaced apart from each other in a vertical direction substantially perpendicular to an upper surface of the substrate, second channels on a second region of the substrate and spaced apart from each other in the vertical direction, a first gate structure on the first region of the substrate and covering at least a portion of a surface of each of the first channels, and a second gate structure on the second region of the substrate and covering at least a portion of a surface of each of the second channels. The second channels may be disposed at heights substantially the same as those of corresponding ones of the first channels, and a height of a lowermost one of the second channels may be greater than a height of a lowermost one of the first channels.

19 Claims, 27 Drawing Sheets

(51) Int. Cl.
*H01L 29/66* (2006.01)
*H01L 29/78* (2006.01)
*H01L 29/10* (2006.01)
*H01L 21/8234* (2006.01)
*H01L 21/02* (2006.01)
*H01L 21/308* (2006.01)

(52) U.S. Cl.
CPC ............ *H01L 21/823412* (2013.01); *H01L 21/823431* (2013.01); *H01L 21/823437* (2013.01); *H01L 21/823468* (2013.01); *H01L 21/823481* (2013.01); *H01L 29/1033* (2013.01); *H01L 29/165* (2013.01); *H01L 29/6656* (2013.01); *H01L 29/6681* (2013.01); *H01L 29/66545* (2013.01); *H01L 29/785* (2013.01)

(58) Field of Classification Search
CPC ..... H01L 21/823412; H01L 21/823431; H01L 21/823437; H01L 21/823468; H01L 21/823481; H01L 21/823807; H01L 21/823814; H01L 21/823842; H01L 21/823878; H01L 27/0886; H01L 27/092; H01L 29/1033; H01L 29/165; H01L 29/42392; H01L 29/66545; H01L 29/6656; H01L 29/6681; H01L 29/775; H01L 29/7848; H01L 29/785; H01L 29/78696; H01L 29/0653; H01L 29/66439
USPC ........................................................ 257/368
See application file for complete search history.

(56) References Cited

U.S. PATENT DOCUMENTS

| | | | |
|---|---|---|---|
| 7,648,883 | B2 | 1/2010 | Park |
| 8,502,318 | B2* | 8/2013 | Thomas ............. H01L 27/1104 |
| | | | 257/365 |
| 9,123,567 | B2 | 9/2015 | Radosavljevic et al. |
| 9,184,087 | B2 | 11/2015 | Chiang et al. |
| 9,224,810 | B2 | 12/2015 | Kim et al. |
| 9,257,545 | B2 | 2/2016 | Leobandung |
| 9,613,871 | B2 | 4/2017 | Suk et al. |
| 9,691,768 | B2 | 6/2017 | Moroz et al. |
| 9,754,965 | B2 | 9/2017 | Chang et al. |
| 9,935,014 | B1* | 4/2018 | Cheng ............. H01L 21/823412 |
| 2017/0133277 | A1* | 5/2017 | Kim .................... H01L 27/0924 |
| 2017/0140933 | A1* | 5/2017 | Lee ................... H01L 21/02603 |
| 2017/0162583 | A1 | 6/2017 | Lee et al. |
| 2017/0250180 | A1* | 8/2017 | Lee .................... H01L 29/42356 |
| 2017/0278842 | A1 | 9/2017 | Song et al. |
| 2017/0294356 | A1 | 10/2017 | Yeh et al. |

* cited by examiner

SEMICONDUCTOR DEVICES HAVING DIFFERENT NUMBERS OF STACKED CHANNELS IN DIFFERENT REGIONS AND METHODS OF MANUFACTURING THE SAME

CROSS-REFERENCE TO RELATED APPLICATION

This application claims priority under 35 U.S.C. § 119 to Korean Patent Application No. 10-2018-0075616, filed on Jun. 29, 2018, in the Korean intellectual Property Office (KIPO), the contents of which are herein incorporated by reference in their entirety.

TECHNICAL HELD

Example embodiments of the present inventive concept relate to a semiconductor device and a method of manufacturing the same, and more particularly, relate to a semiconductor device having a plurality of channels vertically stacked and a method of manufacturing the same.

DISCUSSION OF RELATED ART

In highly integrated semiconductor devices that operate at high speed, multi bridged channel field effect transistors (MBCFETs) may be found. Each MBCFET may include a plurality of channels that are vertically stacked. When a plurality of MBCFETs are found in a semiconductor device with each MBCFET having the same number of channels in each stack, the plurality of MBCFETs may have the same characteristics. Therefore, a method of manufacturing MBCFETs having different characteristics from each other is desirable.

SUMMARY

Example embodiments of the present inventive concept provide a semiconductor device having enhanced characteristics, and a method of manufacturing the same.

According to an example embodiment of the present inventive concept, a semiconductor device may include a substrate including a first region and a second region adjacent to or spaced apart from the first region, first channels disposed on the first region of the substrate, the first channels being spaced apart from each other in a vertical direction substantially perpendicular to an upper surface of the substrate, second channels disposed on the second region of the substrate, the second channels being spaced apart from each other in the vertical direction, a first gate structure disposed on the first region of the substrate covering at least a portion of a surface of each of the first channels, and a second gate structure disposed on the second region of the substrate covering at least a portion of a surface of each of the second channels. The second channels may be disposed at heights substantially the same as those of corresponding ones of the first channels, and a height of a lowermost one of the second channels is greater than a height of a lowermost one of the first channels.

According to an example embodiment of the present inventive concept, a semiconductor device may include a substrate including a first region and a second region adjacent to or spaced apart from the first region, a first transistor including a first gate structure disposed on the first region of the substrate and first channels spaced apart from each other in a vertical direction substantially perpendicular to an upper surface of the substrate, each of the first channels partially extending through the first gate structure, and a second transistor including a second gate structure disposed on the second region of the substrate and second channels spaced apart from each other in the vertical direction, each of the second channels partially extending through the second gate structure. A total number of the first channels is greater than a total number of the second channels, and an uppermost one of the first channels and an uppermost one of the second channels are formed at substantially a same height.

According to an example embodiment of the present inventive concept, a semiconductor device may include a substrate including a first region and a second region adjacent to or spaced apart from the first region, a first active pattern protruding upwardly from the first region of the substrate, a first isolation pattern surrounding a sidewall of the first active pattern, a first transistor including a first gate structure disposed on the first active pattern and the first isolation pattern and first channels spaced apart from each other in a vertical direction substantially perpendicular to an upper surface of the substrate, each of the first channels partially extending through the first gate structure, a second active pattern protruding upwardly from the second region of the substrate, a sacrificial line and a semiconductor line sequentially stacked on the second active pattern, a second isolation pattern surrounding sidewalls of the second active pattern, the sacrificial line and the semiconductor line, and a second transistor including a second gate structure disposed on the semiconductor line and the second isolation pattern and second channels spaced apart from each other in the vertical direction, each of the second channels partially extending through the second gate structure.

According to an example embodiment of the present inventive concept, a semiconductor device may include a substrate including a first region and a second region adjacent to or spaced apart from the first region, first channels disposed on the first region of the substrate, the first channels being spaced apart from each other in a vertical direction substantially perpendicular to an upper surface of the substrate, second channels disposed on the second region of the substrate, the second channels being spaced apart from each other in the vertical direction, a first gate structure disposed on the first region of the substrate, the first gate structure covering at least a portion of a surface of each of the first channels, a second gate structure disposed on the second region of the substrate, the second gate structure covering at least a portion of a surface of each of the second channels, a first source/drain layer disposed on each of opposite sides of the first gate structure in a first direction substantially parallel to the upper surface of the substrate, the first source/drain layer being connected to the first channels, and a second source drain layer disposed on each of opposite sides of the second gate structure in the first direction, the second source/drain layer being connected to the second channels. A height of a lower surface of the first source/drain layer is different from a height of a lower surface of the second source/drain layer.

According to an example embodiment of the present inventive concept, a semiconductor device may include an active pattern extending in a first direction substantially parallel to an upper surface of a substrate, a sacrificial line disposed on the active pattern, the sacrificial line extending in the first direction, a semiconductor line disposed on the sacrificial line, the semiconductor line extending in the first direction and including a material different from that of the sacrificial line, an isolation pattern surrounding sidewalls of the active pattern, the sacrificial line and the semiconductor line, a gate structure disposed on the semiconductor line and the isolation pattern, the gate structure extending in a second direction substantially parallel to the upper surface of the substrate and intersecting with the first direction, channels spaced apart from each other in a vertical direction substantially perpendicular to the upper surface of the substrate, each of the channels extending through the gate structure in the first direction, and a source/drain layer disposed on the semiconductor line, the source drain layer contacting the channels.

According to an example embodiment of the present inventive concept, a semiconductor device may include an active pattern extending on a substrate in a first direction substantially parallel to an upper surface of the substrate, a sacrificial line extending in the first direction on the active pattern, a semiconductor line extending in the first direction on the sacrificial line, the semiconductor line including a material different from that of the sacrificial line, an isolation pattern surrounding sidewalls of the active pattern, the sacrificial line and the semiconductor line, a gate structure disposed on the semiconductor line and the isolation pattern, the gate structure extending in a second direction substantially parallel to the upper surface of the substrate and intersecting with the first direction, channels spaced apart from each other in a vertical direction substantially perpendicular to the upper surface of the substrate, each of the channels extending through the gate structure in the first direction, and a source/drain layer disposed on the semiconductor line, the source/drain layer contacting the channels. A lower surface of the gate structure is lower than an upper surface of the sacrificial line.

According to an example embodiment of the present inventive concept, a method of manufacturing a semiconductor device may include sequentially stacking sacrificial layers and semiconductor layers on a substrate including first and second regions, etching the semiconductor layers, the sacrificial layers and an upper portion of the substrate to form a first fin structure including first sacrificial lines and first semiconductor lines alternately and repeatedly stacked on a first active pattern in a vertical direction substantially perpendicular to an upper surface of the substrate, and to form a second fin structure including second sacrificial lines and second semiconductor lines alternately and repeatedly stacked on a second active pattern in the vertical direction, the first active pattern protruding from an upper surface of the first region of the substrate in the vertical direction, and the second active pattern protruding from an upper surface of the second region of the substrate in the vertical direction, forming a second isolation pattern on the second region of the substrate to surround a sidewall of the second active pattern and a sidewall of a lower portion of the second fin structure including at least a lowermost one of the second sacrificial lines, the second isolation pattern exposing a sidewall of an upper portion of the second fin structure, forming a first isolation pattern on the first region of the substrate to cover a side wall of the first active pattern, the first isolation pattern exposing a sidewall of the first fin structure, after forming a first dummy gate structure on the first isolation pattern to partially cover the first fin structure, etching the first fin structure using the first dummy gate structure as an etching mask to form first sacrificial patterns and first semiconductor patterns alternately and repeatedly stacked, after forming a second dummy gate structure on the second isolation pattern to partially cover the second fin structure, etching an upper portion of the second fin structure using the second dummy gate structure as an etching mask to form second sacrificial patterns and second semiconductor patterns alternately and repeatedly stacked, and transforming the first dummy gate structure and the first sacrificial patterns into a first gate structure, and transforming the second dummy gate structure and the second sacrificial patterns into a second gate structure.

According to an example embodiment of the present inventive concept, a method of manufacturing a semiconductor device may include forming a first fin structure on a first region of a substrate and a second fin structure on a second region of the substrate, the first fin structure including a first active pattern, first sacrificial lines and first semiconductor lines, and the second fin structure including a second active pattern, second sacrificial lines and second semiconductor lines, forming a first isolation pattern and a second isolation pattern on the first and second regions, respectively, of the substrate, the first isolation pattern surrounding the first active pattern and exposing the first fin structure not including the first active pattern, and the second isolation pattern surrounding a lower portion of the second fin structure including the second active pattern and at least a lowermost one of the second sacrificial lines and exposing an upper portion of the second fin structure, and transforming a portion of each of the first sacrificial lines included in the first fin structure into a first gate structure, and transforming a portion of each of the second sacrificial lines included in the upper portion of the second fin structure into a second gate structure.

According to an example embodiment of the present inventive concept, a method of manufacturing a semiconductor device may include forming a fin structure on an active pattern protruding from an upper surface of a substrate in a vertical direction substantially perpendicular to the upper surface of the substrate, the fin structure including sacrificial lines and semiconductor lines alternately and repeatedly stacked in the vertical direction, forming an isolation pattern on the substrate, the isolation pattern surrounding the active pattern and a lower portion of the fin structure including at least a lowermost one of the sacrificial lines and exposing an upper portion of the fin structure, forming a dummy gate structure on the isolation pattern to partially cover the upper portion of the fin structure, etching the upper portion of the fin structure using the dummy gate structure as an etching mask to form sacrificial patterns and semiconductor patterns alternately and repeatedly stacked in the vertical direction, removing the dummy gate structure and the sacrificial patterns to form an opening, and forming a gate structure to fill the opening.

A semiconductor device in accordance with the example embodiments of the present inventive concept may include transistor having different numbers of stacked channels in different regions, so that different electrical characteristics may be implemented in these regions.

BRIEF DESCRIPTION OF THE DRAWINGS

Example embodiments of the present inventive concept will be more clearly understood from the following detailed description taken in conjunction with the accompanying drawings, in which.

Figure 1:
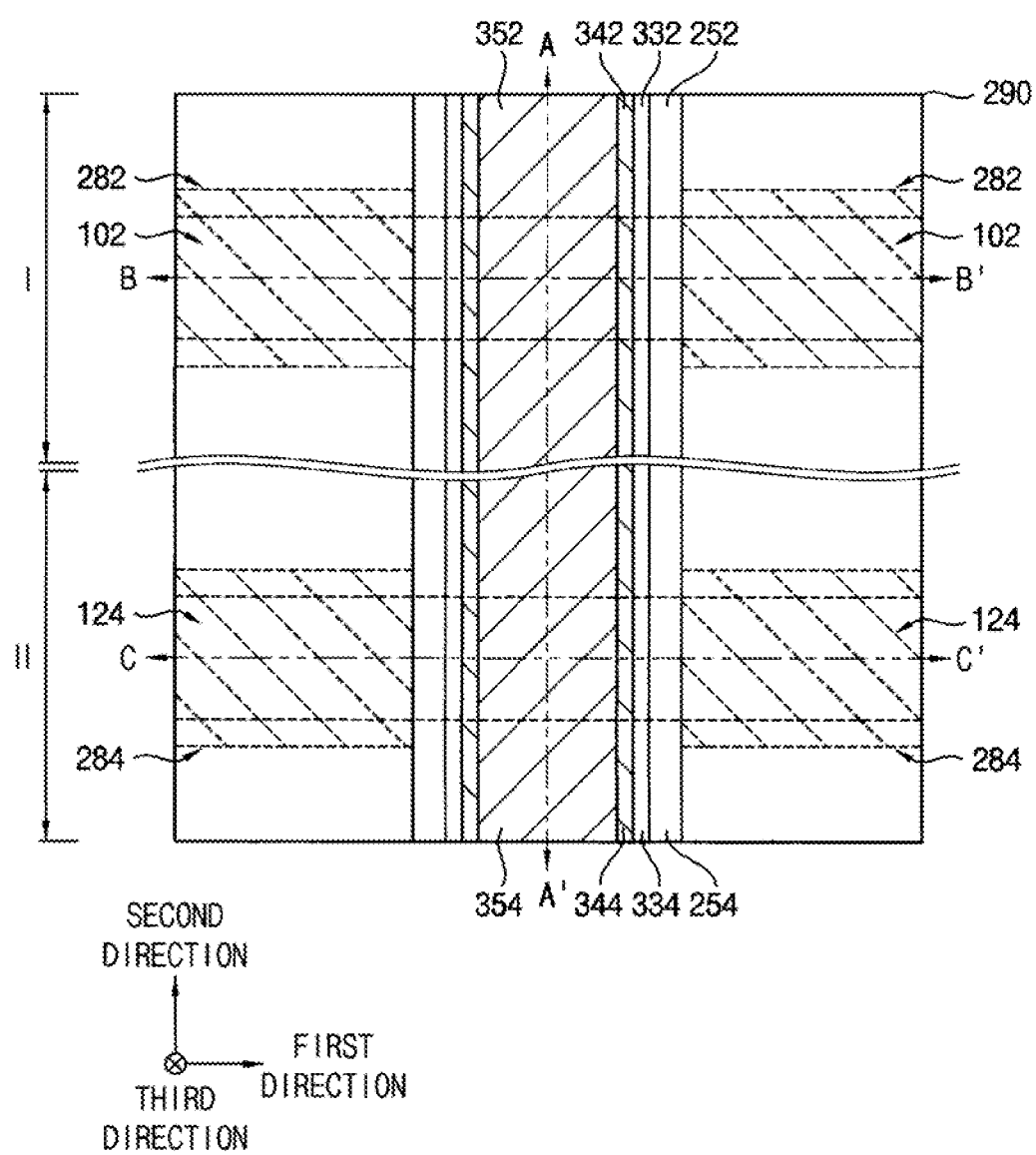
FIGS. 1 to 3 are a plan view and cross-sectional views illustrating a semiconductor device in accordance with an example embodiment of the present inventive concept.

Since the drawings in FIGS. 1-27 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2:
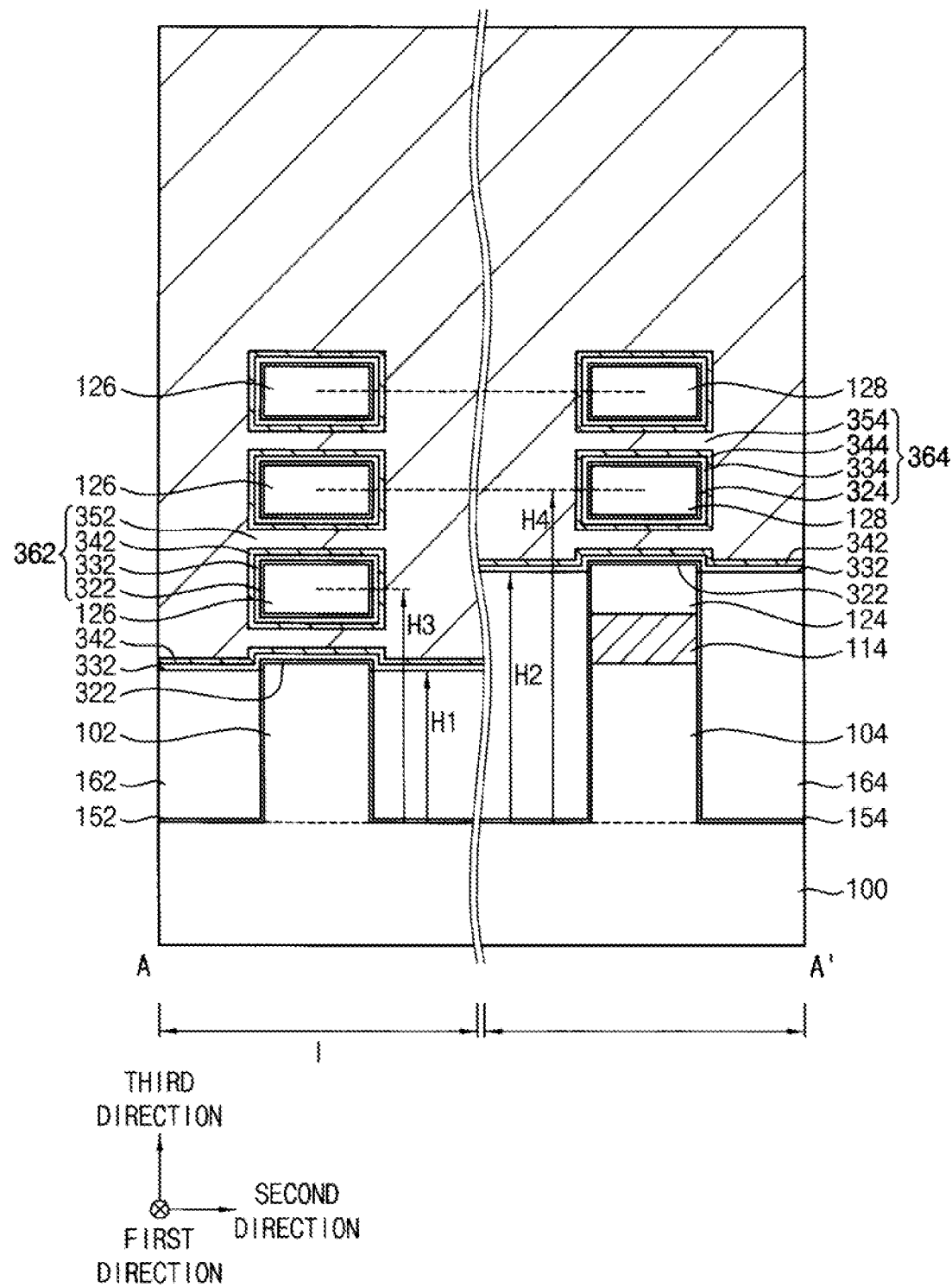
Figure 3:
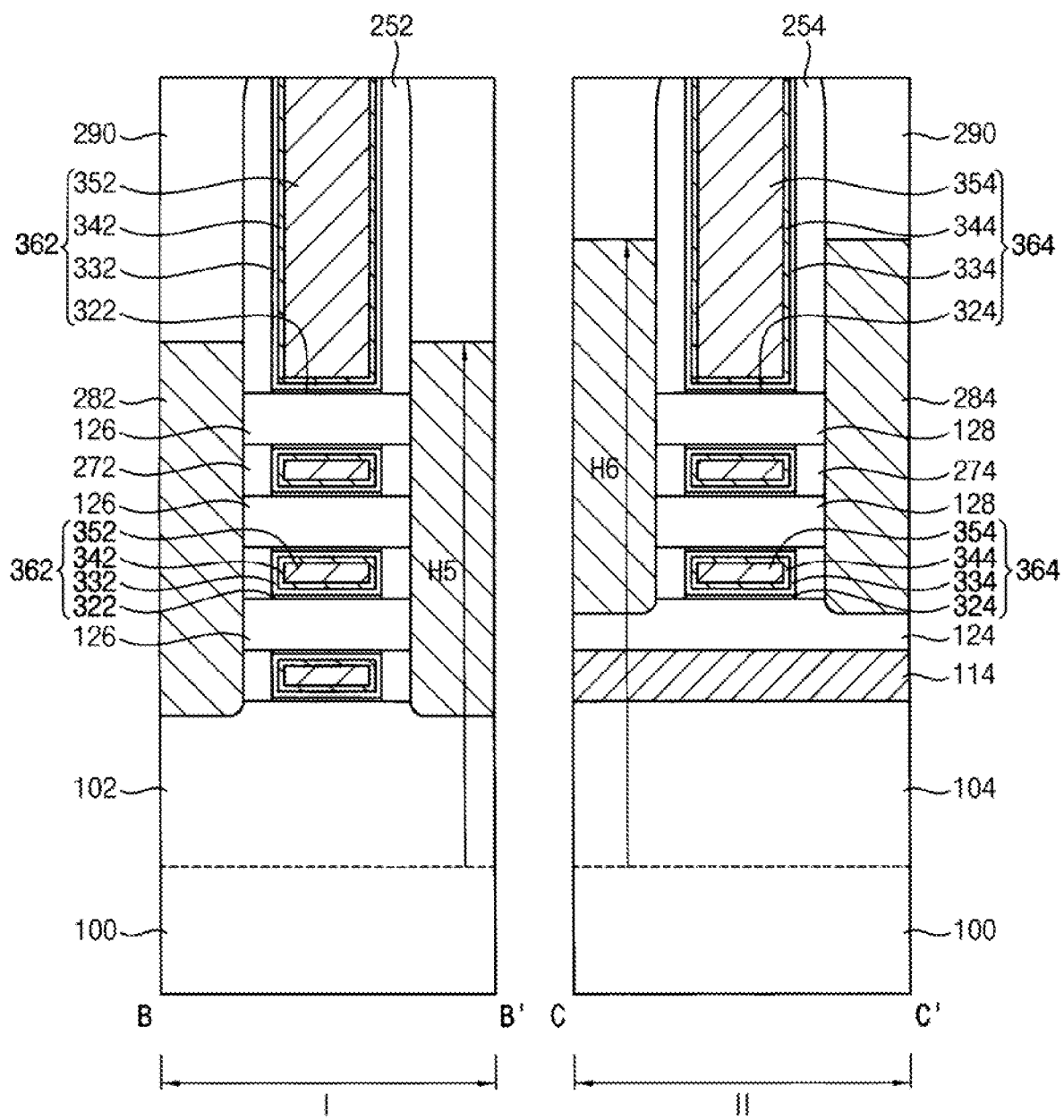

FIGS. 1 to 3 are a plan view and cross-sectional views illustrating a semiconductor device in accordance with an example embodiment of the present inventive concept. Specifically, FIG. 1 is a plan view, FIG. 2 is a cross-sectional view taken along line A-A' of FIG. 1, and FIG. 3 are cross-sectional views taken along lines B-B' and C-C', respectively, of FIG. 1.

Hereinafter, two directions substantially parallel to an upper surface of a substrate and intersecting with each other are defined as first and second directions, respectively, and a direction substantially perpendicular to the upper surface of the substrate is defined as a third direction. The third direction is also defined as a vertical direction. In an example embodiment of the present inventive concept, the first and second directions may be orthogonal to each other.

Referring to FIGS. 1 to 3, the semiconductor device may include first and second transistors formed on first and second regions I and II, respectively, of a substrate 100.

The substrate 100 may include at least one of semiconductor materials such as group IV elements, e.g., silicon (Si), germanium (Ge), silicon-germanium (SiGe), etc., or III-V compounds e.g., gallium arsenide (GaAs), aluminum gallium arsenide (AlGaAs), indium arsenide (InAs), indium gallium arsenide (InGaAs), etc. In an example embodiment of the present inventive concept, the substrate 100 may be a silicon-on-insulator (SOI) substrate or a germanium-on-insulator (GOI) substrate.

The first and second regions I and II of the substrate 100 may be regions adjacent to each other or spaced apart from each other. In an example embodiment of the present inventive concept, the first region I may be a region to which a relatively high electric current may be applied, and the second region II may be a region to Which a relatively low electric current may be applied, however, the present inventive concept may not be limited thereto. For example, the same electric current may be applied to both the first and second regions I and II, while different voltages may be applied to the first and second regions I and II separately. In addition, different device functions may be provided by the first and second regions I and II. An upper surface of the first region I and an upper surface of the second region II of the substrate 100 may be substantially coplanar with each other.

The first transistor included in the semiconductor device may be formed on a first active pattern 102 with a first isolation pattern 162 surrounding the first active pattern 102 on the first region I of the substrate 100, and may include a first gate structure 362, first semiconductor patterns 126, and a first source/drain layer 282.

The first active pattern 102 may protrude upwardly in the third direction from the upper surface of the first region I of the substrate 100, and thus may be referred to as a first active fin. In an example embodiment of the present inventive concept, the first active pattern 102 may extend in the first direction. FIGS. 1 to 3 illustrate only one first active pattern 102, however, the present inventive concept may not be limited thereto, and two or more first active patterns 102 may be formed to be spaced apart from each other in the second direction on the first region I of the substrate 100. The two or more first active patterns 102 may extend in parallel to each other in the first direction. The first active pattern 102 may be formed by partially removing an upper portion of the substrate 100, and thus may be integrally formed with the substrate 100 to include a semiconductor material, e.g., silicon (Si), germanium (Ge), etc., which may thus be substantially the same as the semiconductor material included in the substrate 100.

A sidewall of the first active pattern 102 and the upper surface of the first region I of the substrate 100 may be covered by a first liner 152, and the first isolation pattern 162 surrounding the sidewall of the first active pattern 102 may be formed on the first liner 152. An upper surface of the first isolation pattern 162 and an uppermost surface of the first liner 152 may have a first height H1 in the third direction from the upper surface of the first region I of the substrate 100. The upper surface of the first isolation pattern 162 and the uppermost surface of the first liner 152 may be substantially coplanar with each other. The uppermost surface of the first liner 152 may overlap the first gate structure 362 in the third direction. The first liner 152 may include a nitride, e.g., silicon nitride ($Si_3N_4$), and the first isolation pattern 162 may include an oxide, e.g., tonen silazane (TOSZ).

Each of the first semiconductor patterns 126 may partially extend through the first gate structure 362, more specifically in the first direction, and a plurality of first semiconductor patterns 126 may be formed at a plurality of levels, respectively, to be spaced apart from each other in the third direction from an upper surface of the first active pattern 102. FIGS. 2 and 3 illustrate that the first semiconductor patterns 126 are formed at three levels, respectively, however, the present inventive concept may not be limited thereto. For example, the first semiconductor patterns 126 may be formed at more or less than three levels. In addition, FIGS. 2 and 3 illustrate that one first semiconductor pattern 126 is formed at each level of the three levels on the first region I of the substrate 100, but the present inventive concept may not be limited thereto. For example, two or more first semiconductor patterns 126 may be formed at each level and spaced apart from each other in the second direction on the first region I of the substrate 100. A central portion of a lowermost one of the first semiconductor patterns 126 may have a third height H3 in the third direction from the upper surface of the first region I of the substrate 100.

The first semiconductor patterns 126 may include a material substantially the same as that of the substrate 100 or the first active pattern 102, e.g., silicon (Si). In an example embodiment of the present inventive concept, each of the first semiconductor patterns 126 may serve as a channel of the first transistor, and thus may be referred to as a first channel.

The first gate structure 362 may be formed on the first active pattern 102 and a portion of the first isolation pattern 162 adjacent thereto in the second direction to surround a central portion of each of the first semiconductor patterns 126 in the first direction. For example, the first gate structure 362 may cover at least a portion of a surface of each of the first semiconductor patterns 126. Also, the first gate structure 362 may overlap a portion of the first isolation pattern 162 in the third direction. An upper sidewall and a lower sidewall of the first gate structure 362 may be covered by a first outer spacer 252 and a first inner spacer 272, respectively.

FIGS. 2 and 3 illustrate that the first gate structure 362 covers only the first semiconductor patterns 126 formed on one first active pattern 102, however, the present inventive concept may not be limited thereto. For example, the first gate structure 362 may extend in the second direction on the first region I of substrate 100 on which the first isolation pattern 162 is formed, and may commonly cover the first semiconductor patterns 126 on a plurality of first active patterns 102, which may be formed to be spaced apart from each other in the second direction. The plurality of first active patterns 102 may extend in parallel to each other in the first direction.

FIGS. 2 and 3 also illustrate that one first gate structure 362 is formed on the first region I of the substrate 100, however, the present inventive concept may not be limited thereto, and a plurality of first gate structures 362 spaced apart from each other in the first direction may be formed on the first region I of the substrate 100. The plurality of first gate structures 362 may extend in parallel to each other in the second direction, and may cross the first active pattern 102 which extends in the first direction.

The first gate structure 362 may include a first interface pattern 322, a first gate insulation pattern 332, a first work function control pattern 342, and a first gate electrode 352 sequentially stacked from a surface of each of the first semiconductor patterns 126 or the upper surface of the first active pattern 102. The first gate structure 362 may surround a central portion of each of the first semiconductor patterns 126.

The first interface pattern 322 may be formed on the upper surface of the first active pattern 102 and the surface of each of the first semiconductor patterns 126, and the first gate insulation pattern 332 may be formed on a surface of the first interface pattern 322, and inner walls of the first outer spacer 252 and the first inner spacer 272. The first work function control pattern 342 may be formed on the first gate insulation pattern 332, and the first gate electrode 352 may be formed on the first work function control pattern 342 to fill a space defined between the first semiconductor patterns 126 spaced apart from each other in the third direction, and an inner space defined by the first outer spacer 252 on an uppermost one of the first semiconductor patterns 126.

The first interface pattern 322 may include an oxide, e.g., silicon oxide ($SiO_2$), and the first gate insulation pattern 332 may include a material having a high dielectric constant. The material having the high dielectric constant may include a material having a dielectric constant greater than that of a silicon oxide layer, for example, having a dielectric constant of about 10 to about 25, and may include a metal oxide, e.g., hafnium oxide ($HfO_2$), tantalum oxide ($Ta_2O_5$), zirconium oxide ($ZrO_2$), etc.

The first work function control pattern 342 may include, e.g., titanium nitride (TIN), titanium oxynitride (TiON), tantalum nitride (TaN), tantalum oxynitride (TaON), titanium aluminum nitride (TiAlN), tantalum aluminum nitride (TaAlN), tungsten nitride (WN), tungsten carbonitride (WCN), aluminum oxide ($Al_2O_3$), etc. The first gate electrode 352 may include a metal, e.g., titanium (Ti), aluminum (Al), copper (Cu), tungsten (W), tantalum (Ta), etc., an alloy thereof, or a nitride or carbide thereof.

The first gate structure 362 may include an upper portion, which may be formed on the uppermost one of the first semiconductor patterns 126 and overlapped with the first semiconductor patterns 126 in the third direction, and a lower portion, which may be formed between the first semiconductor patterns 126 and between the first active pattern 102 and a lowermost one of the first semiconductor patterns 126 and overlapped with the first semiconductor patterns 126 in the third direction. The first gate structure 362 may further include a portion formed on the first isolation pattern 162, that is, a lateral portion not overlapped with the first semiconductor patterns 126 in the third direction.

The first outer spacer 252 may cover opposite sidewalls in the first direction of the upper portion of the first gate structure 362 and opposite sidewalls in the first direction of the lateral portion of the first gate structure 362. The first outer spacer 252 may extend along with the first gate structure 362 in the second direction. The first inner spacer 272 may cover opposite sidewalls in the first direction of the lower portion of the first gate structure 362. The first outer spacer 252 may include a nitride, e.g., silicon nitride ($Si_3N_4$), and the first inner spacer 272 may include a nitride, e.g., silicon nitride ($Si_3N_4$), silicon carbonitride (SiCN), silicon boron nitride (SiBN), silicon oxycarbonitride (SiOCN), etc. In an example embodiment of the present inventive concept, the first outer spacer 252 and the first inner spacer 272 may include the same material. Alternatively, the first outer spacer 252 and the first inner spacer 272 may include different materials.

The first source/drain layer 282 may extend in the third direction from the upper surface of the first active pattern 102 to commonly contact opposite sides in the first direction of the first semiconductor patterns 126 at a plurality of levels, respectively, to be connected thereto. For example, the first source/drain layer 282 may be electrically connected to the first channels (the first semiconductor patterns 126). Also, the first source/drain layer 282 may contact a lower portion of the outer sidewall of the first outer spacer 252, and an outer sidewall of the first inner spacer 272. An upper surface of the first source/drain layer 282 may have a fifth height H5 in the third direction from the upper surface of the first region I of the substrate 100.

In an example embodiment of the present inventive concept, the first source/drain layer 282 may include single crystalline silicon carbide (SiC) doped with N-type impurities or single crystalline silicon (Si) doped with N-type impurities, and thus may serve as a source/drain of an NMOS transistor. Alternatively, the first source/drain layer 282 may include silicon-germanium (SiGe) doped with P-type impurities, and thus may serve as a source/drain of a PMOS transistor.

The first gate structure 362 may be electrically insulated from the first source/drain layer 282 by the first outer spacer 252 and the first inner spacer 272.

The first transistor may include a plurality of first semiconductor patterns 126 stacked in the third direction surrounded by the first gate structure 362, and thus may be a multi-bridge channel field effect transistor (MBCFET). Since the first gate structure 362 wraps around the plurality of first semiconductor patterns 126 (first channels), the first transistor has a gate all around transistor structure.

The second transistor included in the semiconductor device may be formed on a second active pattern 104, a second sacrificial line 114 and a second semiconductor line 124 sequentially stacked on the second region II of the substrate 100, with a second isolation pattern 164 surrounding the second active pattern 104, the second sacrificial line 114 and the second semiconductor line 124, and may include a second gate structure 364, second semiconductor patterns 128, and a second source/drain layer 284.

The second active pattern 104 may protrude upwardly in the third direction from the upper surface of the second region II of the substrate 100, and thus may be referred to as a second active fin. In an example embodiment of the present inventive concept, the second active pattern 104 may extend in the first direction. Like the first active pattern 102, a plurality of second active patterns 104 may be formed on the second region II of the substrate 100 to be spaced apart from each other in the second direction. The plurality of second active patterns 104 may extend in parallel to each other in the first direction. The second active pattern 104 may include a material substantially the same as that of the first active pattern 102.

The second sacrificial line 114 may extend in the first direction on the second active pattern 104, and may include, e.g., silicon-germanium (SiGe). The second semiconductor line 124 may extend in the first direction on the second sacrificial line 114, and may include a material substantially the same as that of the second active pattern 104, e.g., silicon (Si). The second sacrificial line 114 may be under the second semiconductor line 124, and may be disposed at a height corresponding to a height of a portion of the first gate structure 362 under the lowermost one of the first semiconductor patterns 126 (the first channels). The second semiconductor line 124 may be disposed at a height corresponding to a height of the lowermost one of the first semiconductor patterns 126 (the first channels). The second semiconductor patterns 128 (second channels to be described) may be overlapped with the second semiconductor line 124 in the third direction (the vertical direction). Thus, the first height H1 (i.e., the height of the upper surface of the first isolation pattern 162) may be smaller than a height of the upper surface of the second sacrificial line 114.

Sidewalls of the second active pattern 104, the second sacrificial line 114 and the second semiconductor line 124 and an upper surface of the second region II of the substrate 100 may be covered by a second liner 154, and the second isolation pattern 164 surrounding the sidewalk of the second active pattern 104, the second sacrificial line 114 and the second semiconductor line 124 may be formed on the second liner 154. An upper surface of the second isolation pattern 164 and an uppermost surface of the second liner 154 may have a second height H2 in the third direction from the upper surface of the second region II of the substrate 100. The upper surface of the second isolation pattern 164 and the uppermost surface of the second liner 154 may be substantially coplanar with each other. The uppermost surface of the second liner 154 may overlap the second gate structure 364 in the third direction. In an example embodiment of the present inventive concept, the second height H2 may be greater than the first height H1. The second height H2 may be greater than the height of the upper surface of the second sacrificial line 114, so that the second liner 154 may protect the second sacrificial line 114. The second liner 154 may include a material substantially the same as that of the first liner 152, and the second isolation pattern 164 may include a material substantially the same as that of the first isolation pattern 162.

Each of the second semiconductor patterns 128 may partially extend through the second gate structure 364, more specifically in the first direction, and a plurality of second semiconductor patterns 128 may be formed at a plurality of levels, respectively, to be spaced apart from each other in the third direction from an upper surface of the second semiconductor line 124. FIGS. 2 and 3 illustrate that the second semiconductor patterns 128 are formed at two levels, respectively, however, the present inventive concept may not be limited thereto. For example, the second semiconductor patterns 128 may be formed at more or less than two levels. In addition, FIGS. 2 and 3 illustrate that one second semiconductor pattern 128 is formed at each level of the two levels on the second region II of the substrate 100, but the present inventive concept may not be limited thereto. For example, two or more second semiconductor patterns 128 may be formed at each level and spaced apart from each other in the second direction on the second region II of the substrate 100. A central portion of a lowermost one of the second semiconductor patterns 128 may have a fourth height H4 in the third direction from the upper surface of the second region II of the substrate 100. In an example embodiment of the present inventive concept, the fourth height H4 may be greater than the second height H2.

In an example embodiment of the present inventive concept, the second semiconductor patterns 128 may be formed at heights substantially the same as those of the corresponding first semiconductor patterns 126, respectively, and an uppermost one of the second semiconductor patterns 128 may be formed at a height substantially the same as that of the uppermost one of the first semiconductor patterns 126. However, a height of the lowermost one of the second semiconductor patterns 128, that is, the fourth height H4 may be greater than a height of the lowermost one of the first semiconductor patterns 126, that is, the third height H3.

The number of the second semiconductor patterns 128 stacked in the third direction may be smaller than the number of the first semiconductor patterns 126 stacked in the third direction, more specifically, may be smaller by the number of the first semiconductor patterns 126 under the height of the lowermost one of the second semiconductor patterns 128. As shown in FIG. 2, the number of the second semiconductor patterns 128 is two which is smaller than the number, which is three, of the first semiconductor patterns 126, and the difference is one which is the number of the first semiconductor patterns 126 under the height of the lowermost one of the second semiconductor patterns 128.

The second semiconductor patterns 128 may include a material substantially the same as that of the first semiconductor patterns 126. In an example embodiment of the present inventive concept, each of the second semiconductor patterns 128 may serve as a channel of the second transistor, and thus may be referred to as a second channel.

The second gate structure 364 may be formed on the second semiconductor line 124, and a portion of the second isolation pattern 164 adjacent thereto in the second direction to surround a central portion of each of the second semiconductor patterns 128 in the first direction. For example, the second gate structure 364 may cover at least a portion of a surface of each of the second semiconductor patterns 128. Also, the second gate structure 364 may overlap a portion of the second isolation pattern 164 in the third direction. An upper sidewall and a lower sidewall of the second gate structure 364 may be covered by a second outer spacer 254 and a second inner spacer 277, respectively. The upper sidewall may be on a portion of the second gate structure 364 formed on the uppermost one of the second semiconductor patterns 128, and the lower sidewall may be on a portion of the second gate structure 364 formed between the second semiconductor patterns 128 and between the second semiconductor line 124 and a lowermost one of the second semiconductor patterns 128.

Similar to the first gate structure 362, the second gate structure 364 may extend in the second direction on the second region II of substrate 100 on which the second isolation pattern 164 is formed, and may commonly cover the second semiconductor patterns 128 on a plurality of second semiconductor lines 124, respectively, which may be formed to be spaced apart from each other in the second direction. The plurality of second semiconductor lines 124 may extend in parallel to each other in the first direction. Also, one or a plurality of second gate structures 364 spaced apart from each other in the first direction may be formed on the second region II of the substrate 100.

The second gate structure 364 may include a second interface pattern 324, a second gate insulation pattern 334, a second work function control pattern 344, and a second gate electrode 354 sequentially stacked from a surface of each of the second semiconductor patterns 128 or the upper surface of the second semiconductor line 124.

The second interface pattern 324 may be formed on the upper surface of the second semiconductor line 124 and the surface of each of the second semiconductor patterns 128, and the second gate insulation pattern 334 may be formed on a surface of the second interface pattern 324, and inner walls of the second outer spacer 254 and the second inner spacer 274. The second work function control pattern 344 may be formed on the second gate insulation pattern 334, and the second gate electrode 354 may be formed on the second work function control pattern 344 to fill a space defined between the second semiconductor patterns 128 spaced apart from each other in the third direction, and an inner space defined by the second outer spacer 254 on the uppermost second semiconductor pattern 128.

The second interface pattern 324, the second gate insulation pattern 334, the second work function control pattern 344 and the second gate electrode 354 may include materials substantially the same as those of the first interface pattern 322, the first gate insulation pattern 332, the first work function control pattern 342 and the first gate electrode 352, respectively.

Similar to the first gate structure 362, the second gate structure 364 may also include an upper portion, a lower portion and a lateral portion. The second outer spacer 254 may cover opposite sidewalls, i.e., the upper sidewalls, in the first direction of the upper portion of the second gate structure 364 and opposite sidewalls in the first direction of the lateral portion of the second gate structure 364, and the second inner spacer 274 may cover opposite sidewalls, i.e., the lower sidewalls, in the first direction of the lower portion of the second gate structure 364. The second outer spacer 254 and the second inner spacer 274 may include materials substantially the same as those of the first outer spacer 252 and the first inner spacer 272, respectively.

The second source/drain layer 284 may extend in the third direction from the upper surface of the second semiconductor line 124 to commonly contact opposite sidewalls in the first direction of the second semiconductor patterns 128 at a plurality of levels, respectively, to be connected thereto. That is, the second source/drain layer 284 may be electrically connected to the second channels (i.e., the second semiconductor patterns 128). Also, the second source/drain layer 284 may contact a lower portion of the outer sidewall of the second outer spacer 254, and an outer sidewall of the second inner spacer 274. An upper surface of the second source/drain layer 284 may have a sixth height H6 in the third direction from the upper surface of the second region II of the substrate 100. In an example embodiment of the present inventive concept, the sixth height H6 may be greater than the fifth height H5.

In an example embodiment of the present inventive concept, the second source/drain layer 284 may include single crystalline silicon carbide (SiC) doped with N-type impurities or single crystalline silicon (Si) doped with N-type impurities, and thus may serve as a source/drain of an NMOS transistor. Alternatively, the second source/drain layer 284 may include silicon-germanium (SiGe) doped with P-type impurities, and thus may serve as a source/drain of a PMOS transistor.

The second gate structure 364 may be electrically insulated from the second source/drain layer 284 by the second outer spacer 254 and the second inner spacer 274.

The second transistor may include a plurality of second semiconductor patterns 128 stacked in the third direction surrounded by the second gate structure 364, and thus may be a multi-bridge Channel field effect transistor (MBCFET). Since the second gate structure 364 wraps around the plurality of second semiconductor patterns 128 (second channels), the second transistor has a gate all around transistor structure.

In the semiconductor device, the first transistor on the first region I of the substrate 100 may include the first channels at a plurality of first levels, respectively, to be spaced apart from each other in the third direction, and the second transistor on the second region II of the substrate 100 may include the second channels at a plurality of second levels, respectively, to be spaced apart from each other in the third direction. The second levels may be formed at heights corresponding to those of upper ones of the first levels, and thus the number of the second levels may be smaller than the number of the first levels. The difference between the number of the first levels and the number of the second levels may be the number of those lower ones of the first levels formed at heights not corresponding to those of the second levels.

In FIGS. 1 to 3, the semiconductor device including the first and second transistors has been described as being formed on the first and second regions I and II, respectively, of the substrate 100. The first isolation pattern 162 and the first liner 152 have been described as being formed on the first region I of the substrate 100, and the second isolation pattern 164 and the second liner 154 have been described as being formed on the second region II of the substrate 100. Since the first and second isolation patterns 162 and 164 may be formed as an integer part and may be indistinguishable, the first isolation pattern 162 may be described as a first portion of an isolation pattern, and the second isolation pattern 164 may be described as a second portion of the isolation pattern. Since the first and second liners 152 and 154 may be formed as an integer part and may be indistinguishable, the first liner 152 may be described as a first portion of a liner, and the second liner 154 may be described as a second portion of the liner. In addition, the first and second gate structures 362 and 364 may be formed as an integer part and may be indistinguishable, and thus a lower surface of the gate structure (i.e. the lower surface of the first gate structure 362) may be lower than an upper surface of the second sacrificial line 114.

The semiconductor device may include transistors having different numbers of the stacked channels in different regions, so that different electrical characteristics may be implemented in these regions. Thus, the semiconductor device according to an example embodiment of the present inventive concept may include a plurality of MBCFETS having different numbers of stacks within one device. Accordingly, various device functions may be provided within one device.

The semiconductor device may further include a contact plug, a wiring, etc., electrically connected to the first and second source/drain layers 282 and 284 and/or the first and second gate structures 362 and 364, respectively.

FIGS. 4 to 24 are plan views and cross-sectional views illustrating stages of a method of manufacturing a semiconductor device in accordance with an example embodiment of the present inventive concept. Specifically, FIGS. 4, 6, 15 and 18 are plan views, and FIGS. 5, 7 to 14, 16 to 17 and 19 to 24 are cross-sectional views.

FIGS. 5, 7 to 14, 16 and 24 are cross-sectional views taken along lines A-A' of corresponding plan views, and each of FIGS. 17 and 19 to 23 include cross-sectional views taken along lines B-B' and C-C' of a corresponding plan view.

Figure 4:
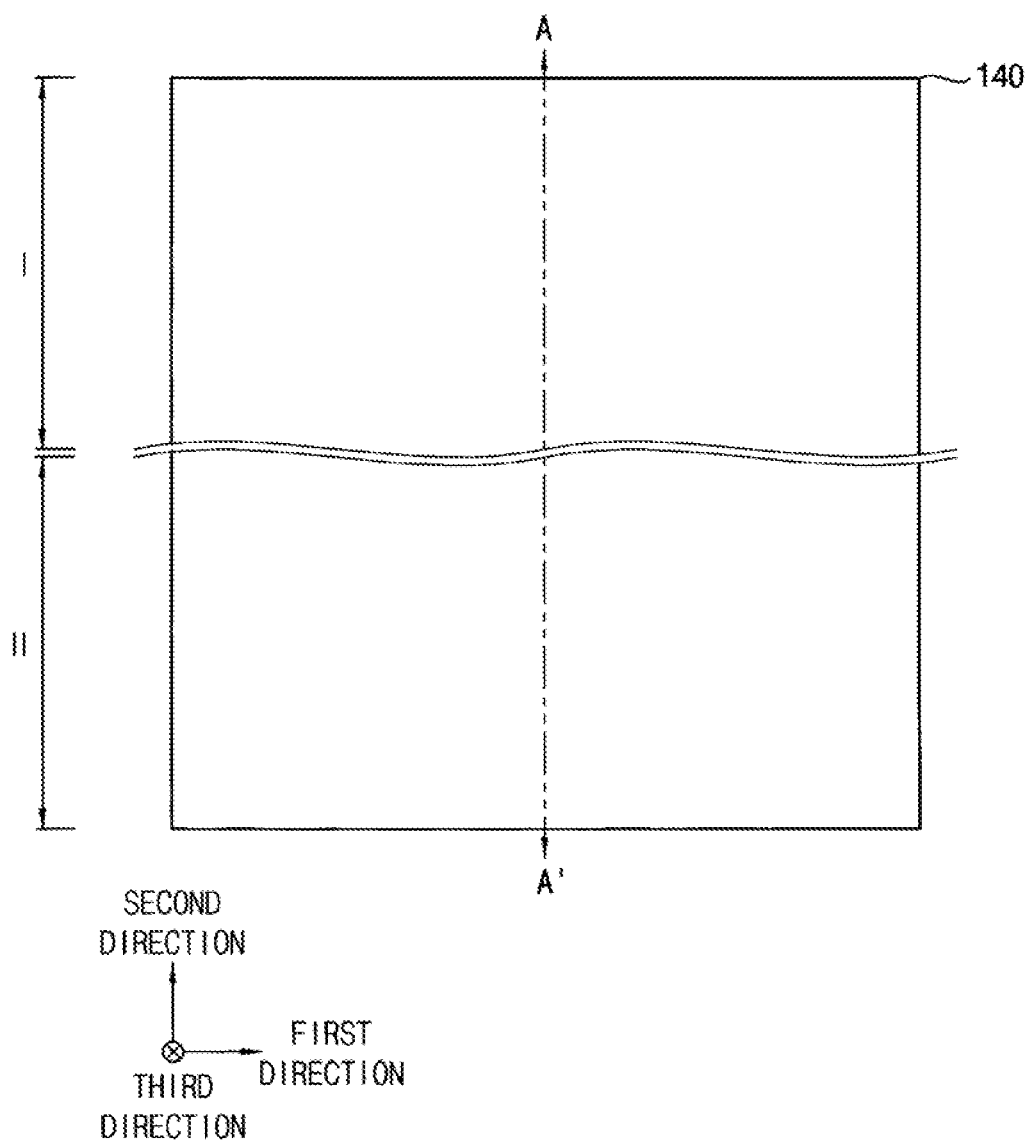
FIGS. 4 to 24 are plan views and cross-sectional views illustrating stages of a method of manufacturing a semiconductor device in accordance with an example embodiment of the present inventive concept.
Figure 5:
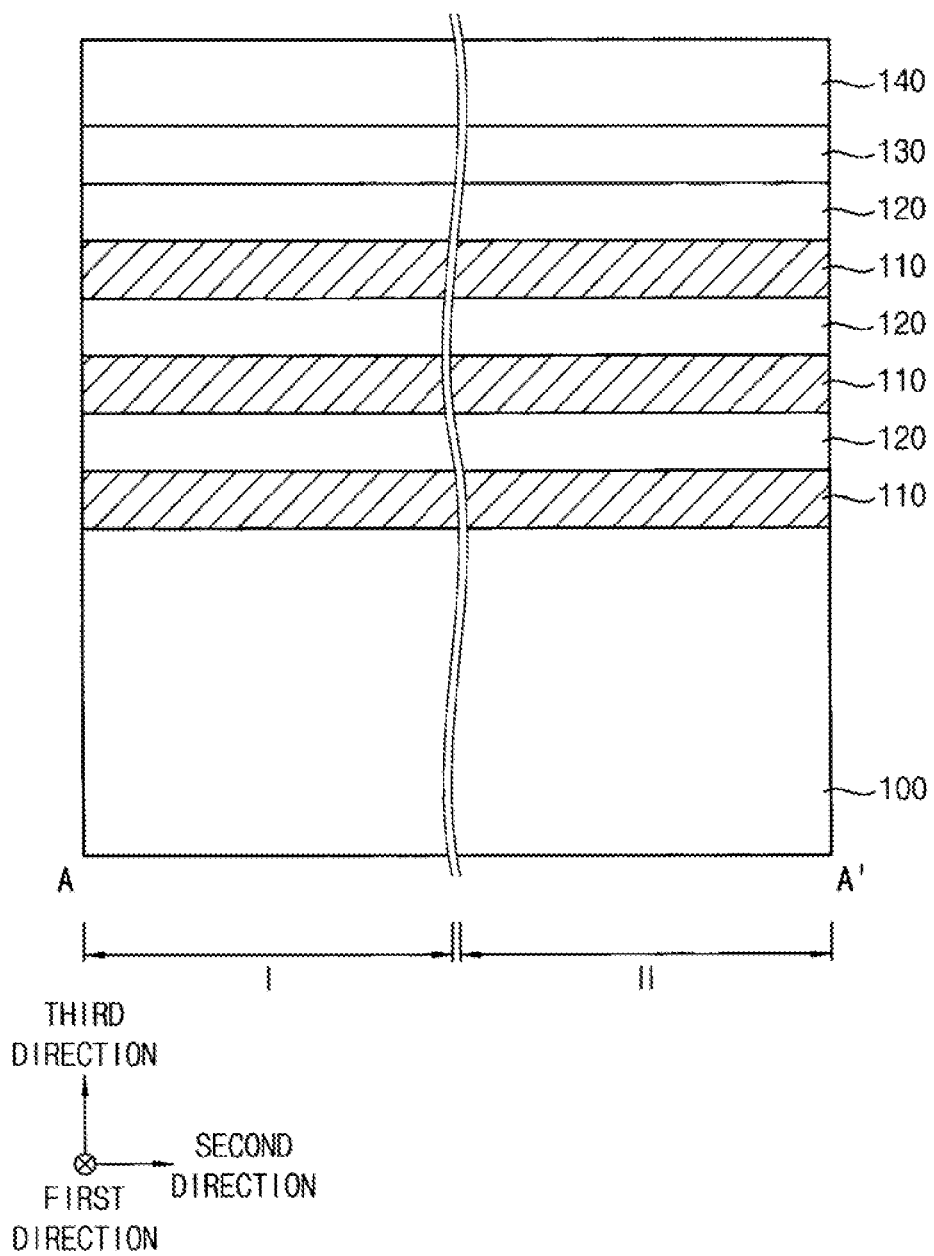

Referring to FIGS. 4 and 5, after alternately and repeatedly stacking a first sacrificial layer 110 and a semiconductor layer 120 on a substrate 100 including first and second regions I and II, a pad layer 130 and a mask layer 140 may be sequentially formed on an uppermost one of the semiconductor layers 120.

FIG. 5 illustrates that each of the first sacrificial layer 110 and the semiconductor layer 120 is formed at three levels, however, the present inventive concept may not be limited thereto, and the first sacrificial layer 110 and the semiconductor layer 120 may be formed at more or less than three levels.

In an example embodiment of the present inventive concept, the first sacrificial layer 110 and the semiconductor layer 120 may be formed by an epitaxial growth process using an upper portion of the substrate 100 as a seed.

In an example embodiment of the present inventive concept, the first sacrificial layer 110 may be formed by performing an epitaxial growth process using a silicon source gas, e.g., dichlorosilane ($SiH_2Cl_2$) gas, and a germanium source gas, e.g., germanium tetrahydride ($GeH_4$), and thus a single crystalline silicon-germanium (SiGe) layer may be formed. In an example embodiment of the present inventive concept, the semiconductor layer 120 may be formed by performing an epitaxial growth process using a silicon source gas, e.g., disilane ($Si_2H_6$) gas, and thus a single crystalline silicon (Si) layer may be formed.

The pad layer 130 may include an oxide, e.g., silicon oxide ($SiO_2$), and the mask layer 140 may include a nitride, e.g., silicon nitride ($Si_3N_4$). The pad layer 130 and the mask layer 140 may be formed by a chemical vapor deposition (CVD) process, an atomic layer deposition (ALD) process, a physical vapor deposition (PVD) process, or the like.

Figure 6:
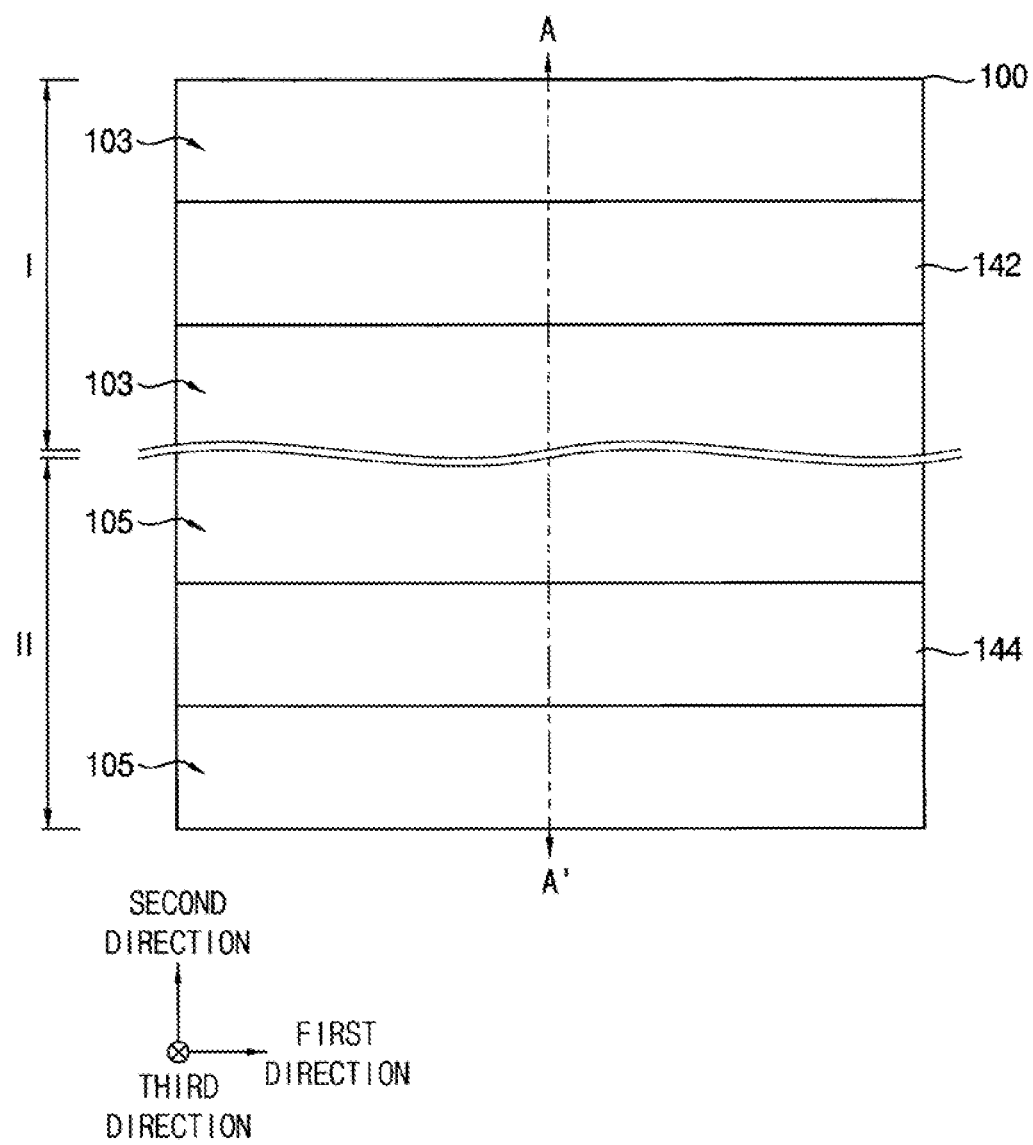
Figure 7:
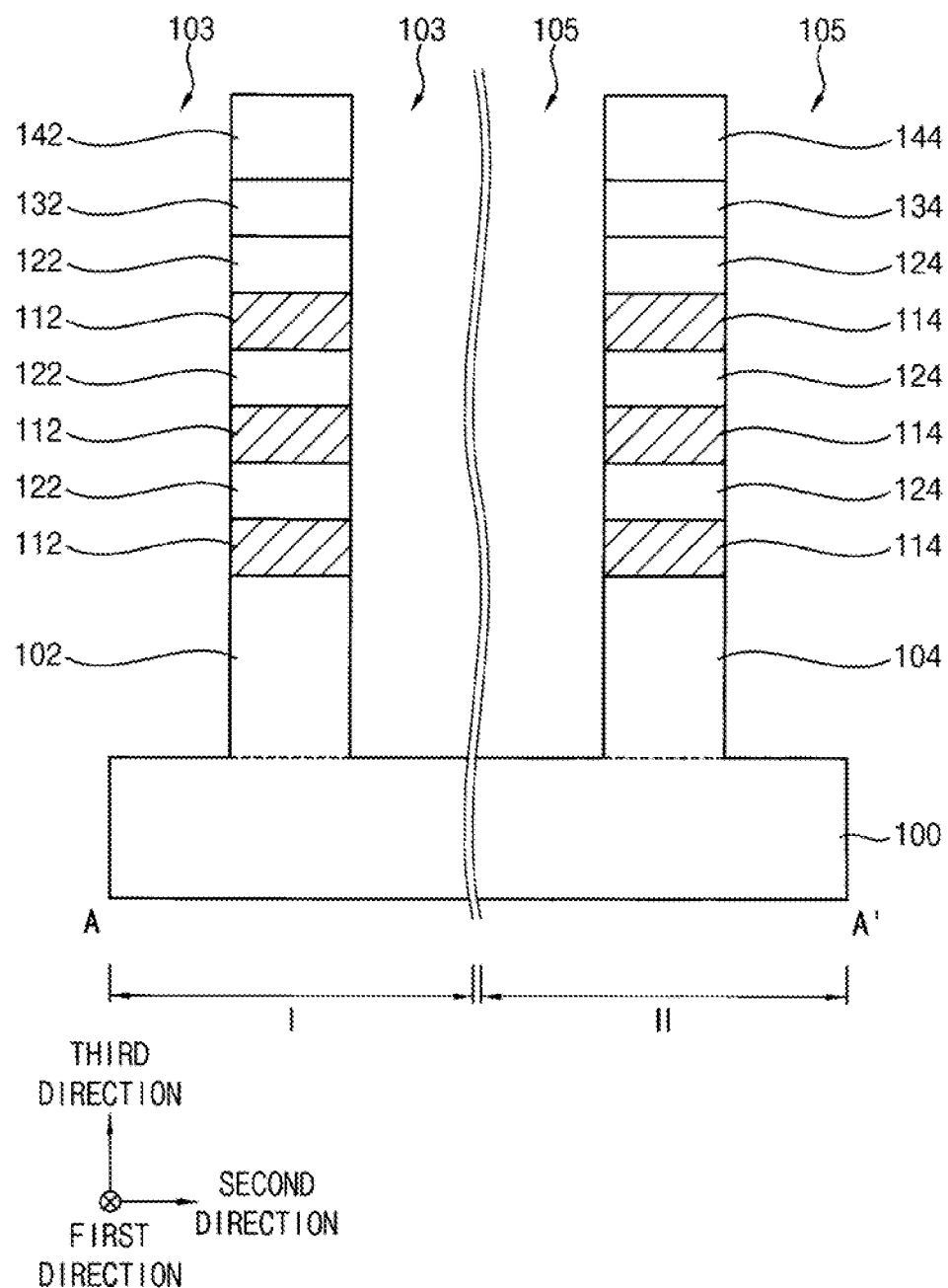

Referring to FIGS. 6 and 7, first and second masks 142 and 144 may be formed on the first and second regions I and II, respectively, of the substrate 100 by patterning the mask layer 140. The first and second masks 142 and 144 may be formed through a photolithographic process and an anisotropic etching process. First and second trench 103 and 105 may be formed on the first and second regions I and II, respectively, of the substrate 100 by etching the pad layer 130, the semiconductor layers 120, the first sacrificial layers 110, and the upper portion of the substrate 100 thereunder using the first and second masks 142 and 144 as an etching mask.

A first active pattern 102 extending in the first direction may be formed on the first region I of the substrate 100, and a first fin structure including first sacrificial lines 112 and first semiconductor lines 122 alternately and repeatedly stacked may be formed on the first active pattern 102. A first pad pattern 132 and the first mask 142 sequentially stacked may also be formed on the first fin structure. Hereinafter, the first active pattern 102, the first fin structure, the first pad pattern 132 and the first mask 142 sequentially stacked may be altogether referred to as a first structure.

A second active pattern 104 extending in the first direction may be formed on the second region II of the substrate 100, and a second fin structure including second sacrificial lines 114 and second semiconductor lines 124 alternately and repeatedly stacked may be formed on the second active pattern 104. A second pad pattern 134 and the second mask 144 sequentially stacked may also be formed on the second fin structure. Hereinafter, the second active pattern 104, the second fin structure, the second pad pattern 134 and the second mask 144 sequentially stacked may be altogether referred to as a second structure.

One or a plurality of first structures spaced apart from each other in the second direction may be formed on the first region I of the substrate 100, and one or a plurality of second structures spaced apart from each other in the second direction may be formed on the second region II of the substrate 100. FIG. 7 shows only one first structure and only one second structure as an example.

Figure 8:
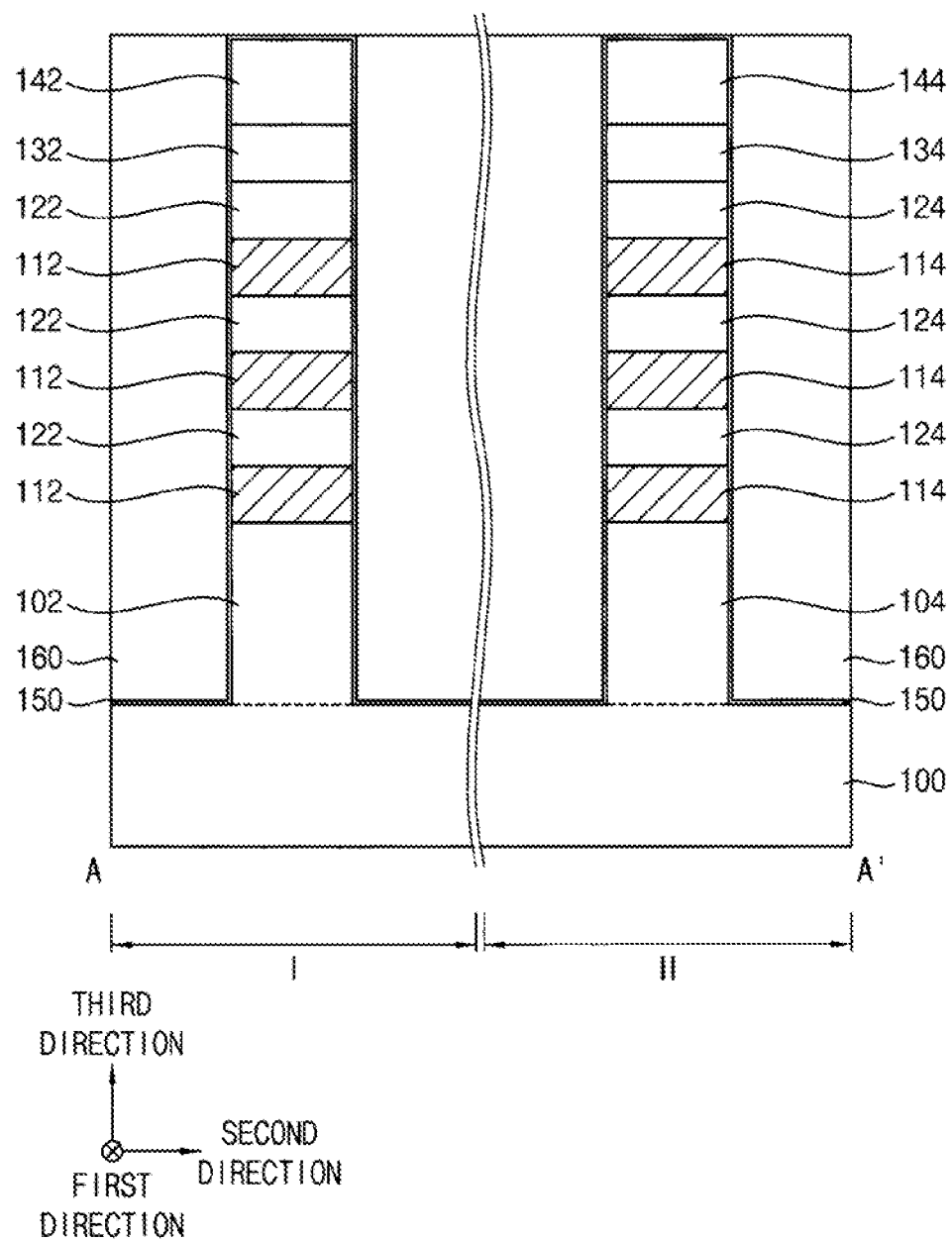

Referring to FIG. 8, a liner layer 150 may be formed on surfaces of the first and second structures and an upper surface of the substrate 100, and an isolation layer 160 filling the first and second trenches 103 and 105 and having an upper surface sufficiently higher than upper surfaces of the first and second structures may be formed on the liner layer 150.

In an example embodiment of the present inventive concept, the liner layer 150 may include a nitride, e.g., silicon nitride ($Si_3N_4$), and the isolation layer 160 may include an oxide, e.g., tonen silazane (TOSZ).

The liner layer 150 may cover the first and second sacrificial layers 112 and 114, and/or the first and second semiconductor lines 122 and 124 included in the first and second structures, respectively, so as to prevent the oxidation thereof.

The isolation layer 160 may be planarized until portions of the liner layer 150 on upper surfaces of the first and second structures are exposed. In an example embodiment of the present inventive concept, the planarization process may include a chemical mechanical polishing (CMP) process and/or an etch back process.

Figure 9:
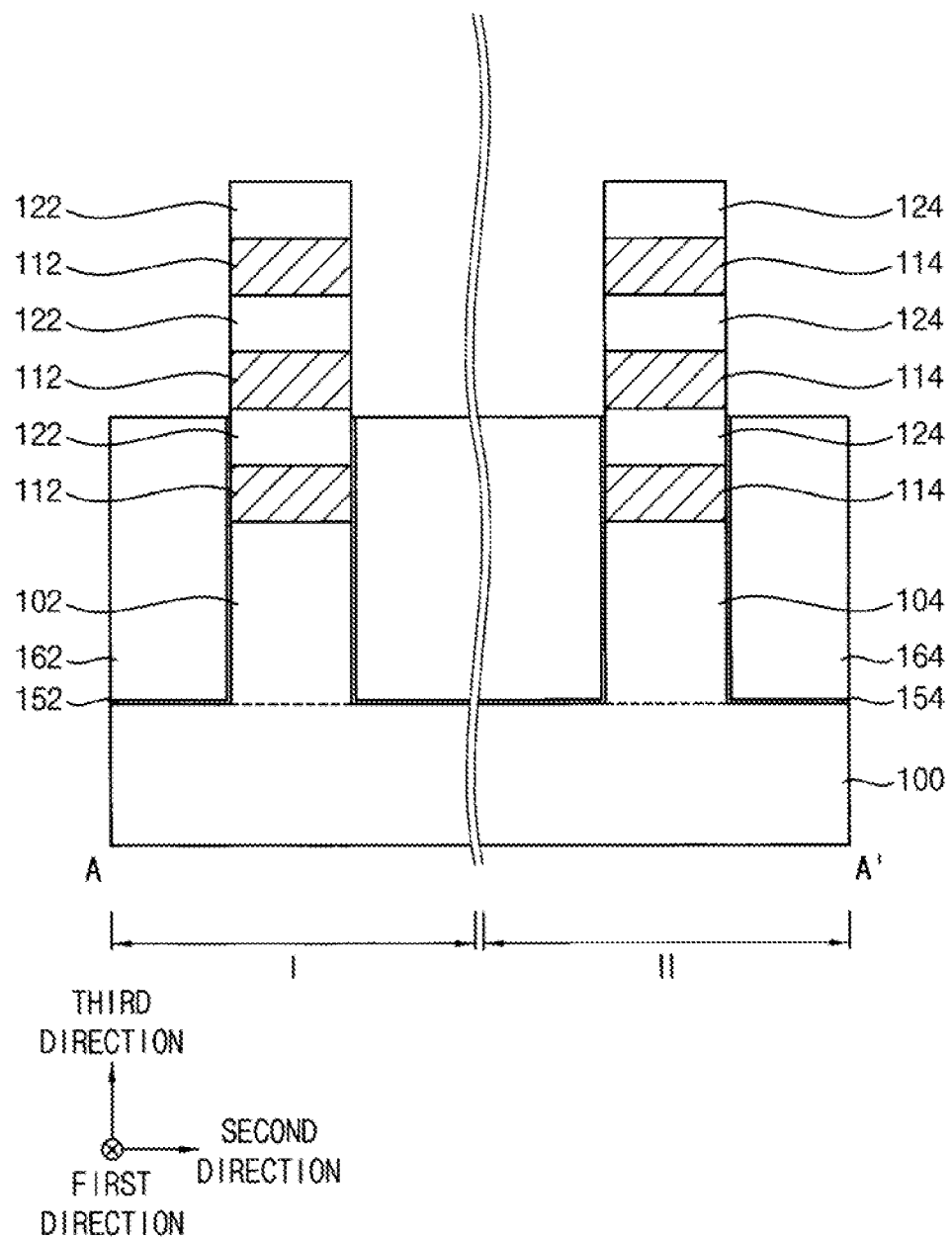

Referring to FIG. 9, after removing portions of the liner layer 150 on upper surfaces and sidewalls of the first and second masks 142 and 144, together with the first and second masks 142 and 144, an upper portion of the isolation layer 160 may be removed. When the upper portion of the isolation layer 160 is removed, the first and second pad patterns 132 and 134 may also be removed.

As the upper portion of the isolation layer 160 is removed, portions of the liner layer 150 covering upper sidewalls of the first and second fin structures may be exposed, and as the exposed portions of the liner layer 150 is removed, upper sidewalk of the first and second fin structures may be exposed.

The first and second active patterns 102 and 104, the first and second fin structures formed on the first and second active patterns 102 and 104, the first and second liners 152 and 154 covering lower sidewalls of the first and second fin structures, sidewalk of the first and second active patterns 102 and 104 and a portion of the upper surface of the substrate 100, and first and second isolation patterns 162 and 164 formed on the first and second liners 152 and 154 to fill lower portions of the first and second trenches 103 and 105, may be formed on the first and second regions I and II of the substrate 100, respectively.

In an example embodiment of the present inventive concept, upper surfaces of the first and second isolation patterns 162 and 164 may be formed at heights lower than or substantially the same as those of lower surfaces of middle ones of the first and second sacrificial lines 112 and 114 included in the first and second fin structures, respectively, and may be formed at heights higher than those of upper surfaces of lowermost ones of the first and second sacrificial lines 112 and 114, respectively. However, the present inventive concept may not be limited thereto. For example, the upper surfaces of the first and second isolation patterns 162 and 164 may be formed at heights at least higher than those of the upper surfaces of the lowermost ones of the first and second sacrificial lines 112 and 114, and at least lower than or substantially the same as those of lower surfaces of uppermost ones thereof.

Figure 10:
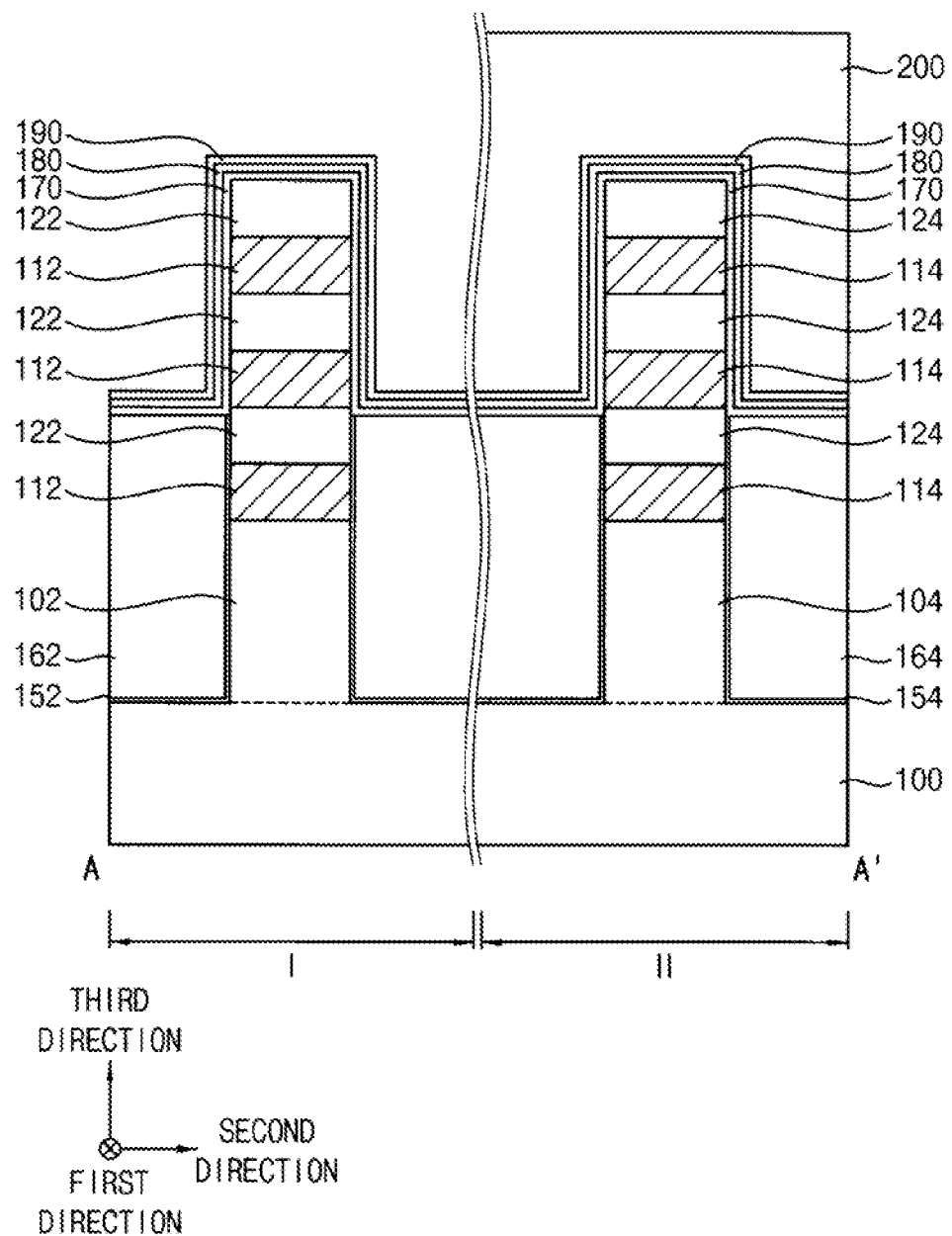

Referring to FIG. 10, after sequentially forming third to fifth sacrificial layers 170, 180 and 190 on the exposed upper surfaces and upper sidewalls of the first and second fin structures, uppermost surfaces of the first and second liners 152 and 154, and upper surfaces of the first and second isolation patterns 162 and 164, a first photoresist pattern 200 covering the fifth sacrificial layer 190 may be formed on the second region II of the substrate 100. The third to fifth sacrificial layers 170, 180 and 190 may be formed by a CVD process, an ALD process, a PVD process, or the like. The first photoresist pattern 200 may be formed by a photolithographic process.

In an example embodiment of the present inventive concept, the third to fifth sacrificial layers 170, 180 and 190 may include an oxide, a nitride and an oxide, respectively.

Figure 11:
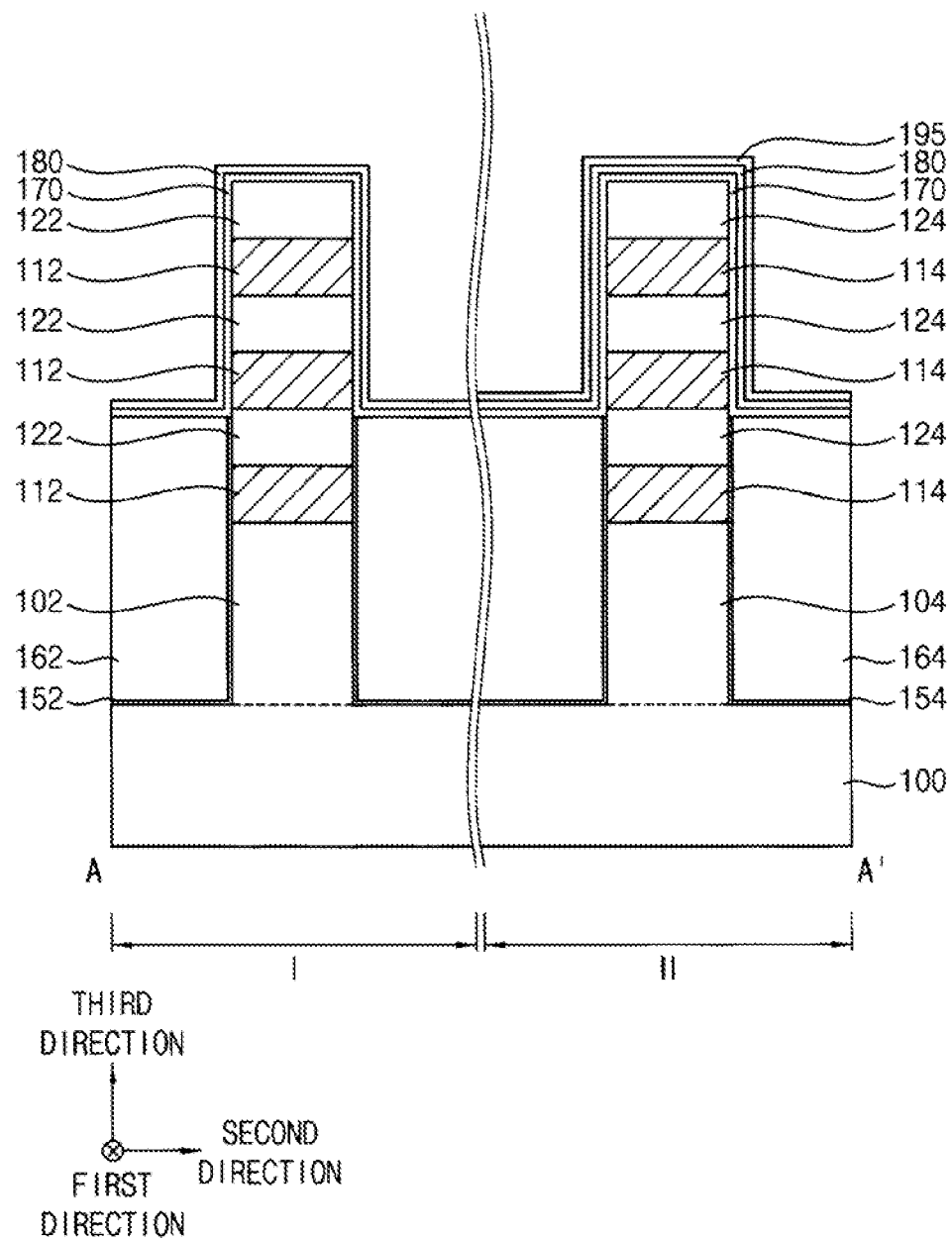

Referring to FIG. 11, after removing a portion of the fifth sacrificial layer 190 on the first region I of the substrate 100, the first photoresist pattern 200 may be removed. Accordingly, a fifth sacrificial pattern 195 may remain on the second region II of the substrate 100.

The fifth sacrificial layer 190 may be removed by, e.g., a wet etching process, and the first photoresist pattern 200 may be removed by, e.g., ashing process and/or a stripping process.

Figure 12:
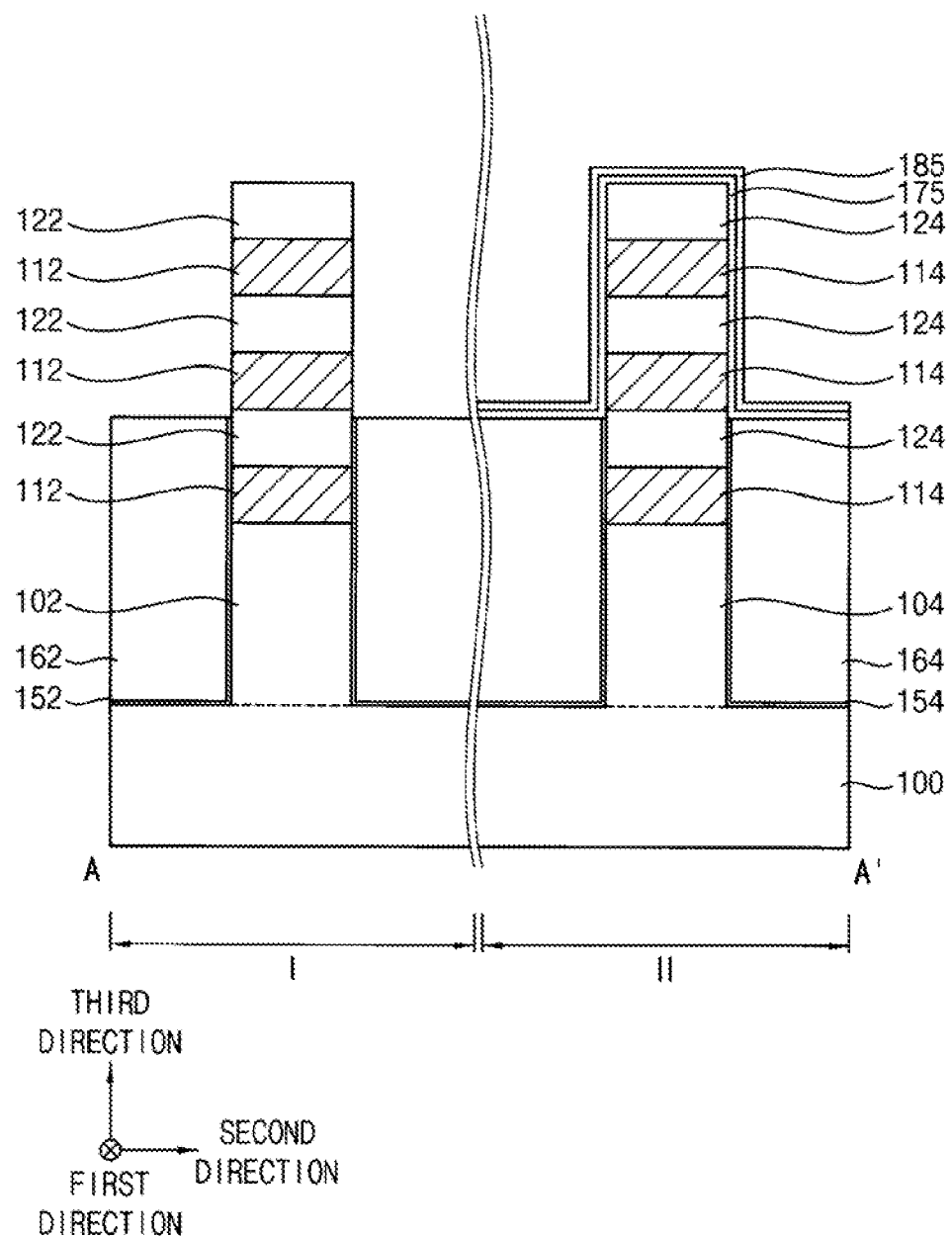

Referring to FIG. 12, after removing a portion of the fourth sacrificial layer 180 on the first region I of the substrate 100, a portion of the third sacrificial layer 170 on the first region of the substrate 100 may be removed to expose an upper surface of the first isolation pattern 162. The fifth sacrificial pattern 195 remaining on the second region II of the substrate 100 may also be removed. Accordingly, a third sacrificial pattern 175 and a fourth sacrificial pattern 185 sequentially stacked may remain on the second region II of the substrate 100.

The portion of the fourth sacrificial layer 180 and the portion of the third sacrificial layer 170 on the first region I of the substrate 100, and the fifth sacrificial pattern 195 on the second region II of the substrate 100 may be removed by, e.g., a wet etching process.

Figure 13:
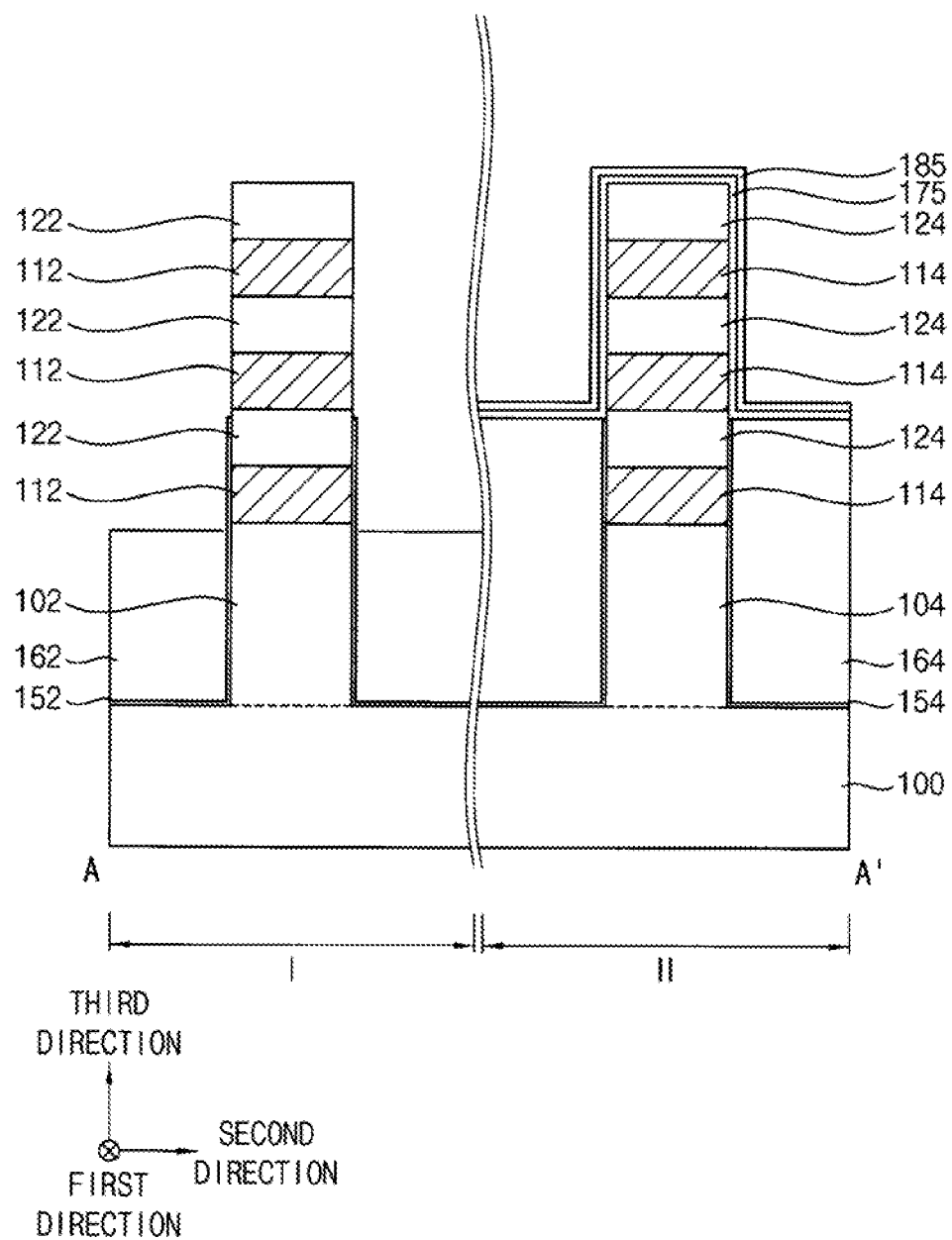

Referring to FIG. 13, an upper portion of the first isolation pattern 162 remaining on the first region I of the substrate 100 may be further removed, and thus an upper portion of the first liner 152 covering a lower sidewall of the first fin structure may be exposed.

In an example embodiment of the present inventive concept, an upper surface of the first isolation pattern 162 after the removal process may be formed at a height substantially the same as or lower than that of an upper surface of the first active pattern 102. For example, the upper surface of the first isolation pattern 162 may be firmed at a height substantially the same as or lower than that of a lower surface of the lowermost one of the first sacrificial lines 112. Also, the height of the upper surface of the first isolation pattern 162 on the first region I of the substrate 100 after the removal process may be lower than a height of an upper surface of the second isolation pattern 164 on the second region II of the substrate 100.

Figure 14:
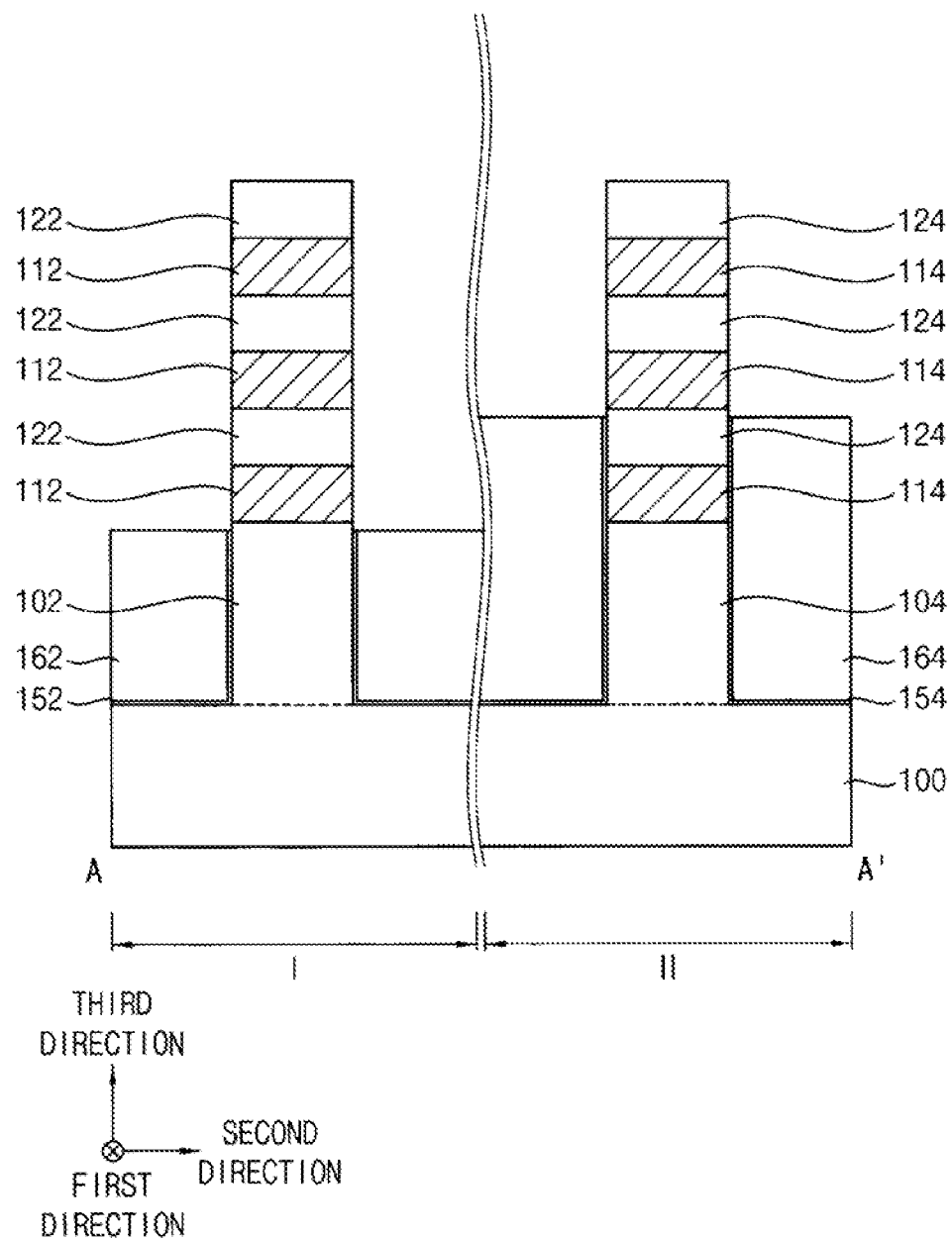

Referring to FIG. 14, the fourth sacrificial pattern 185 remaining on the second region II of the substrate 100 may be removed, and the exposed upper portion of the first liner 152 on the first region I of the substrate 100 may also be removed. For example, both the fourth sacrificial pattern 185 and the first liner 152 may be formed of the same or similar nitride and may be removed by the same etch process.

The third sacrificial pattern 175 remaining on the second region II of the substrate 100 may be removed to expose an upper surface of the second fin structure.

The third and fourth sacrificial patterns 175 and 185 on the second region II of the substrate 100 and the upper portion of the first liner 152 on the first region I of the substrate 100 may be removed by, e.g., a wet etching process.

Figure 15:
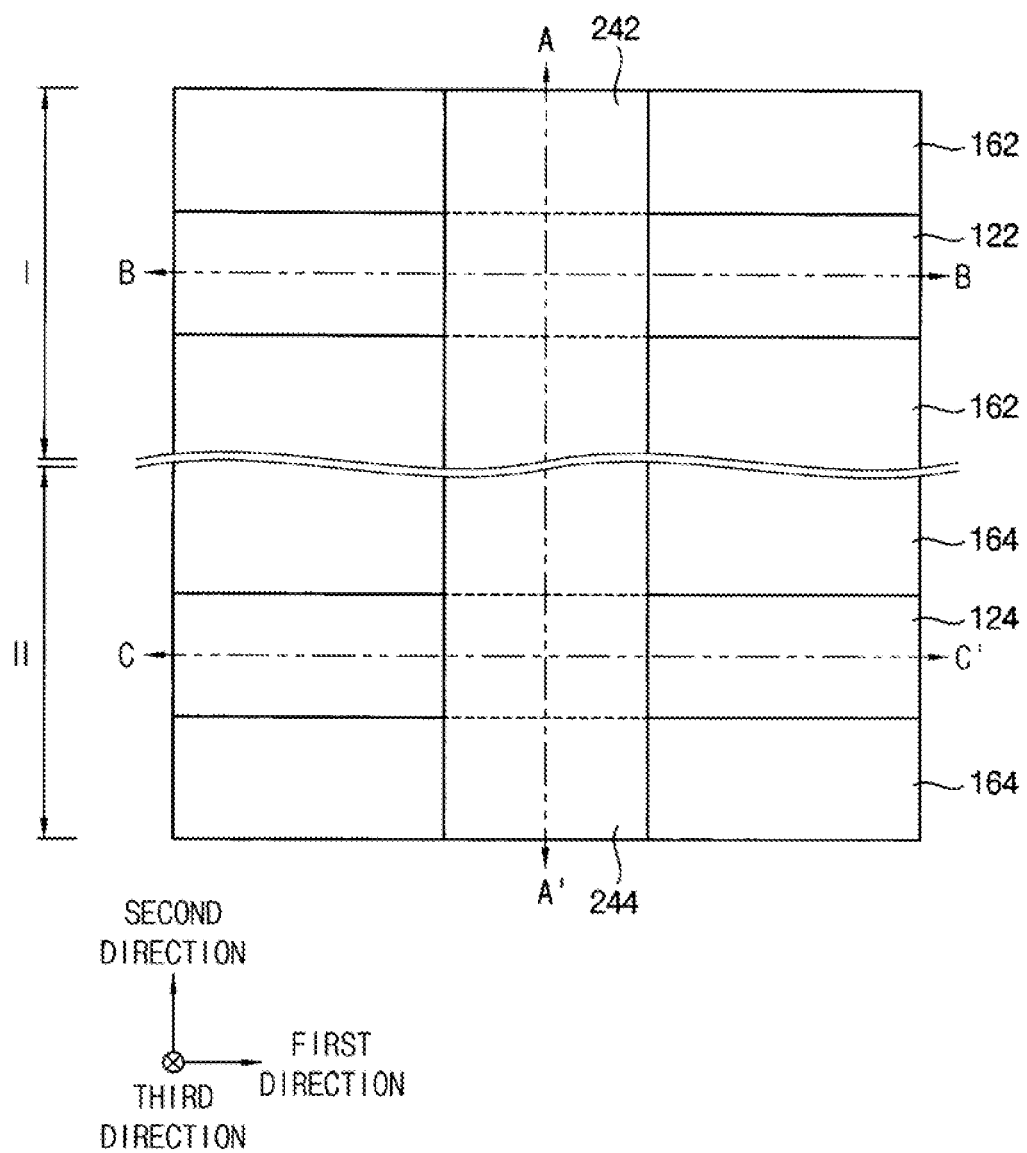
Figure 16:
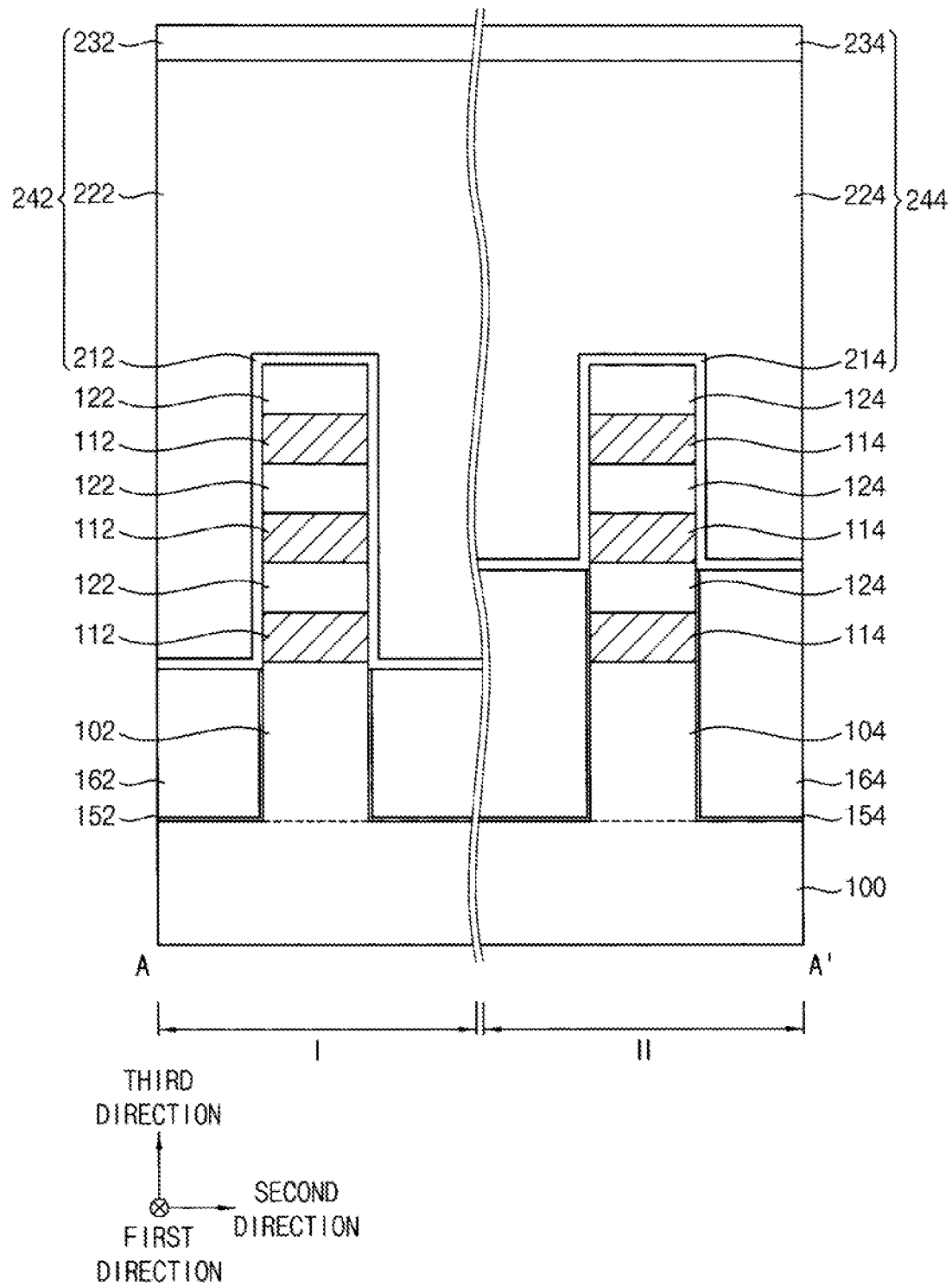
Figure 17:
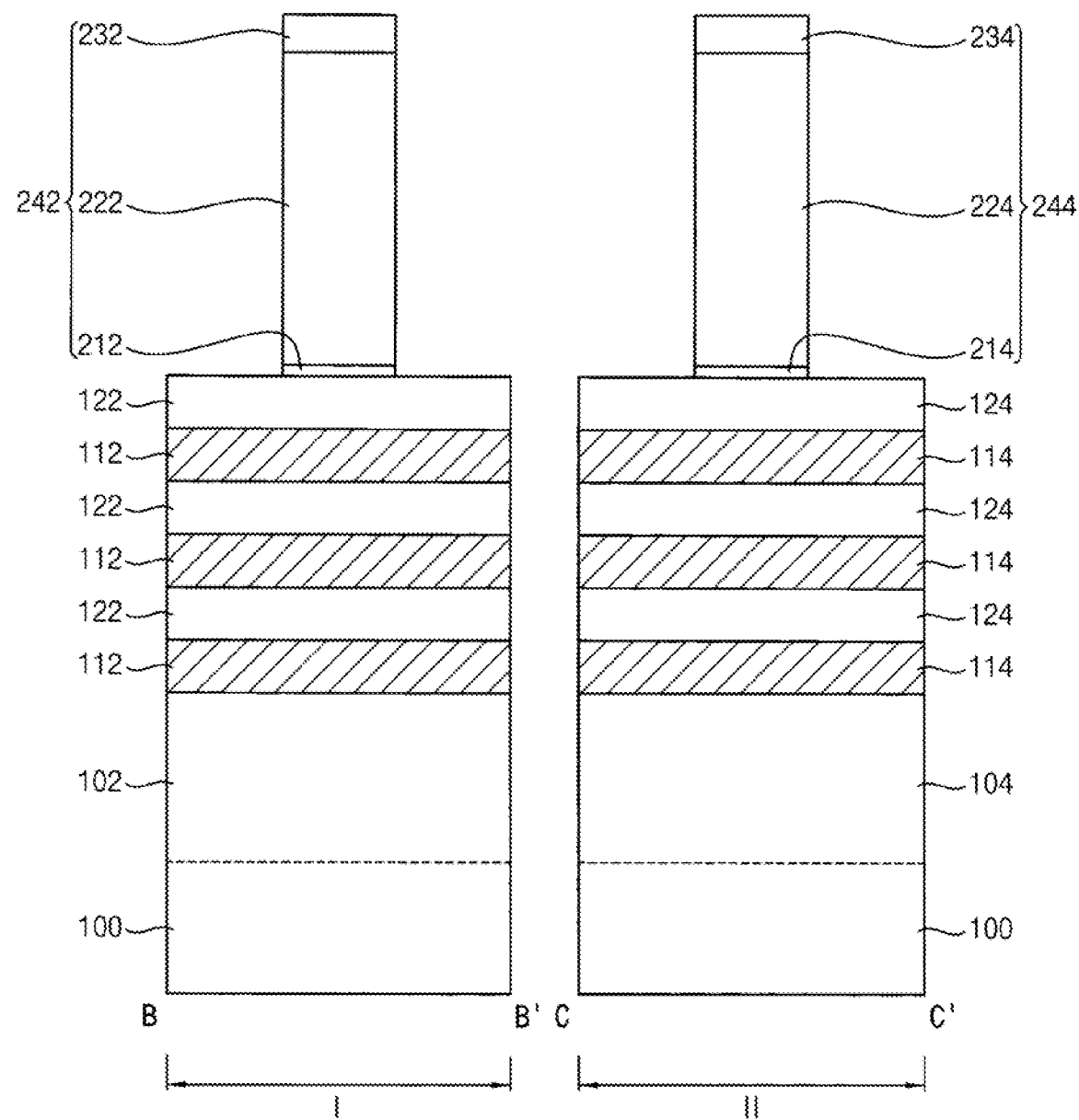

Referring to FIGS. 15 to 17, a first dummy gate structure 242 and a second dummy gate structure 244 partially covering the first fin structure and an upper portion of the second fin structure, respectively, may be formed on the first and second isolation patterns 162 and 164, respectively.

A dummy gate insulation layer, a dummy gate electrode layer and a dummy gate mask layer may be sequentially formed on the first fin structure, the upper portion of the second fin structure, and the first and second isolation patterns 162 and 164. Second photoresist patterns each extending in the second direction may be formed on the dummy gate mask layer on the first and second regions I and II of the substrate 100, respectively, and the dummy gate mask layer may be etched using the second photoresist patterns as an etching mask to form the first and second dummy gate masks 232 and 234 on the first and second regions I and II of the substrate 100, respectively. The forming of the second photoresist patterns may include a photolithographic process, and the forming of the first and second dummy gate masks 232 and 234 may include an anisotropic etching process such as reactive ion etching (RIE) process.

The dummy gate insulation layer may include an oxide, e.g., silicon oxide ($SiO_2$), the dummy gate electrode layer may include, e.g., polysilicon (Si), and the dummy gate mask layer may include a nitride, e.g., silicon nitride ($Si_3N_4$).

The dummy gate electrode layer and the dummy gate insulation layer may be etched using the first and second dummy gate masks 232 and 234 as an etching mask to form a first dummy gate electrode 222 and a first dummy gate insulation pattern 212, respectively, on the first region I of the substrate 100, and to form a second dummy gate electrode 224 and a second dummy gate insulation pattern 214, respectively, on the second region II of the substrate 100.

The first dummy gate insulation pattern 212, the first dummy gate electrode 222, and the first dummy gate mask 232 sequentially stacked on the first fin structure and a portion of the first isolation pattern 162 adjacent thereto may form a first dummy gate structure 242 on the first region I of the substrate 100, and the second dummy gate insulation pattern 214, the second dummy gate electrode 224, and the second dummy gate mask 234 sequentially stacked on the second fin structure and a portion of the second isolation pattern 164 adjacent thereto may form a second dummy gate structure 244 on the second region II of the substrate 100.

In an example embodiment of the present inventive concept, the first dummy gate structure 242 may extend in the second direction on the first fin structure and the first isolation pattern 162, and may cover an upper surface and opposite sidewalls in the second direction of the first fin structure. The first dummy gate structure 242 may cross the first fin structure which extends in the first direction. Also, the second dummy gate structure 244 may extend in the second direction on the second fin structure and the second isolation pattern 164, and may cover an upper surface and opposite sidewalls in the second direction of the second fin structure. The second dummy gate structure 244 may cross the second fin structure which extends in the first direction.

Figure 18:
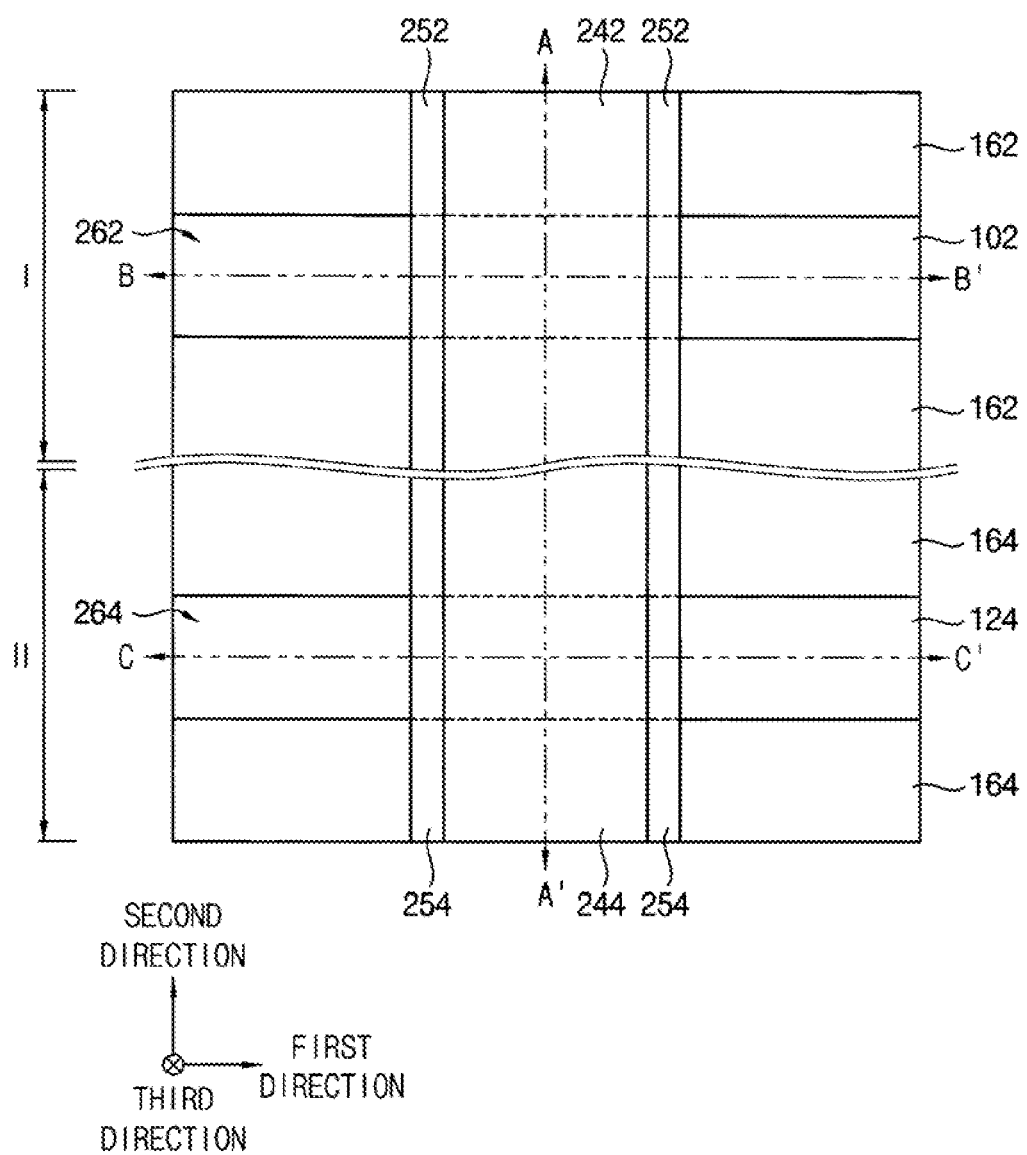
Figure 19:
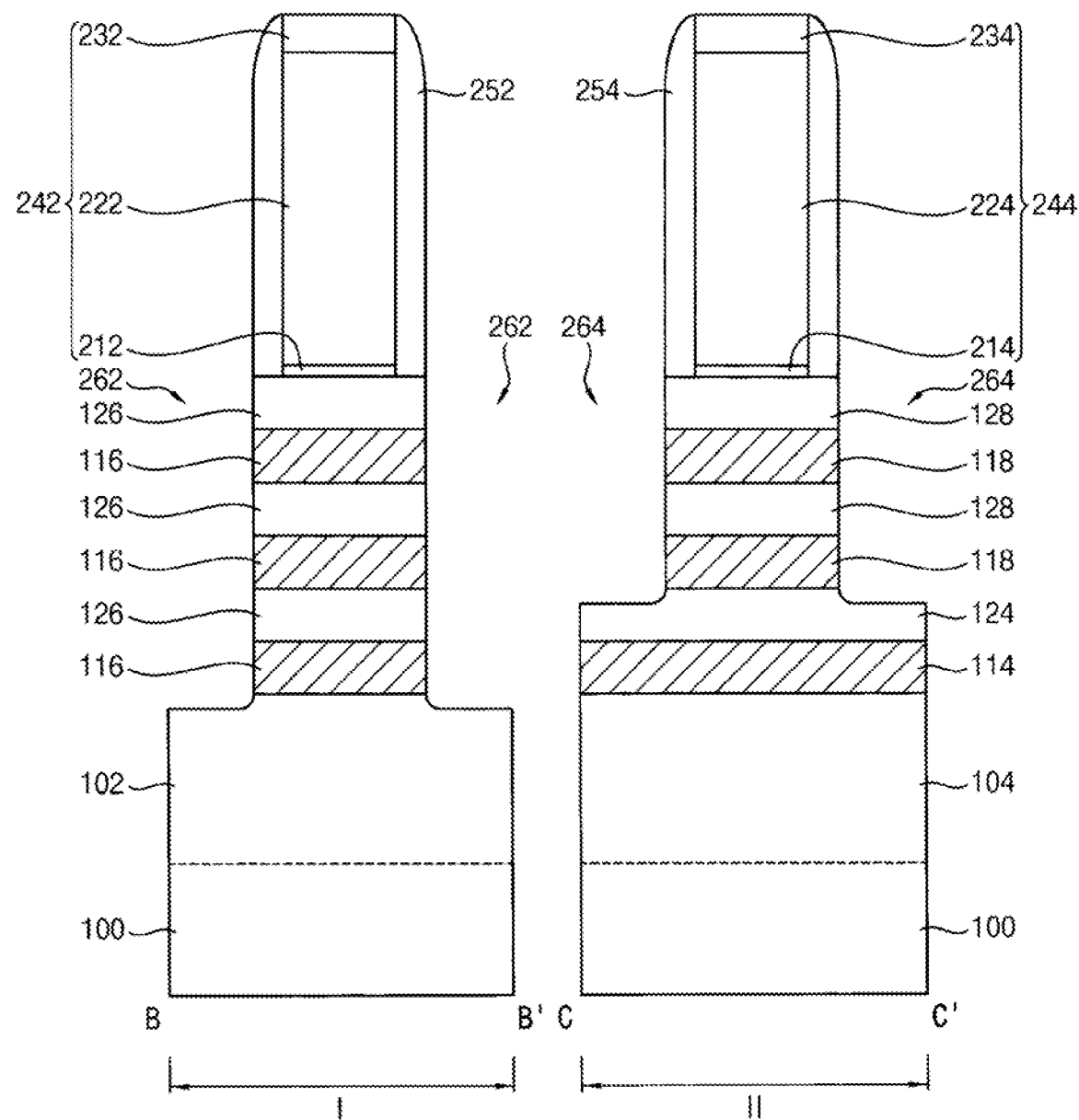

Referring to FIGS. 18 and 19, first and second outer spacers 252 and 254 may be formed on sidewalls of the first and second dummy gate structures 242 and 244, respectively.

After conformally forming a first spacer layer on the substrate 100 on which the first and second fin structures, the first and second isolation patterns 162 and 164, and the first and second dummy gate structures 242 and 244 are formed, the first spacer layer may be anisotropically etched to form the first outer spacer 252 covering the opposite sidewalls in the first direction of the first dummy gate structure 242, and to form the second outer spacer 254 covering the opposite sidewalls in the first direction of the second dummy gate structure 244.

The exposed first fin structure may be etched using the first dummy gate structure 242 and the first outer spacer 252 as an etching mask to form a first opening 262 exposing an upper surface of the first active pattern 102 on the first region I of the substrate 100. However, hereinafter, not only a space exposing the upper surface of the first active pattern 102, but also a space exposing a portion of the first isolation pattern 162 adjacent thereto in the second direction may be altogether referred to as the first opening 262. For example, the first opening 262 may extend in the second direction along with the first dummy gate structure 242 and the first outer spacer 252.

An exposed upper portion of the exposed second fin structure may be etched using the second dummy gate structure 244 and the second outer spacer 254 as an etching mask to form a second opening 264 exposing an upper surface of the lowermost one of the second semiconductor lines 124 of the second fin structure. However, hereinafter, not only a space exposing the lowermost one of the second semiconductor lines 124, but also a space exposing a portion of the second isolation pattern 164 adjacent thereto in the second direction may be altogether referred to as the second opening 264. For example, the second opening 264 may extend in the second direction along with the second dummy gate structure 244 and the second outer spacer 254.

In an example embodiment of the present inventive concept, a depth of the first opening 262 in the third direction may be greater than a depth of the second opening 264 in the third direction. Accordingly, processes for forming the first and second openings 262 and 264 may be separately performed. Alternatively, when the second opening 264 having a relatively low depth is formed, an upper portion of the first opening 262 may also be formed, and then the first opening 262 may be expanded downwardly with additional etch process. For example, the first opening 262 may be formed to have a depth in the third direction deep enough to reach a height the same as that of the upper surface of the first isolation pattern 162, and the second opening 264 may be formed to have a depth in the third direction deep enough to reach a height the same as that of the upper surface of the second isolation pattern 164.

The first sacrificial lines 112 and the first semiconductor lines 122 under the first dummy gate structure 242 and the first outer spacer 252 may be transformed into first sacrificial patterns 116 and first semiconductor patterns 126, respectively, and the first fin structure extending in the first direction on the first active pattern 102 may be divided into a plurality of first fin structures spaced apart from each other in the first direction. In an example embodiment of the present inventive concept, each of the first semiconductor patterns 126 may serve as a channel of the transistor including the first semiconductor patterns 126.

The second sacrificial lines 114 and the second semiconductor lines 124 at two upper levels except for the lowermost level under the second dummy gate structure 244 and the second outer spacer 254 may be transformed into second sacrificial patterns 118 and second semiconductor patterns 128, respectively, and an upper portion of the second fin structure extending in the first direction on the lowermost one of the second semiconductor lines 124 may be divided into a plurality of second fin structures spaced apart from each other in the first direction. In an example embodiment of the present inventive concept, the second semiconductor patterns 128 except for the lowermost one thereof may serve as a channel of the transistor including the second semiconductor patterns 128.

Hereinafter, for the convenience of explanation, the first dummy gate structure 242, the first outer spacer 252 on each of the opposite sidewalls of the first dummy gate structure 242, and the first fin structure may be referred to as a third structure, and the second dummy gate structure 244, the second outer spacer 254 on each of the opposite sidewalls of the second dummy gate structure 244, and the second fin structure may be referred to as a fourth structure. In an example embodiment of the present inventive concept, the third structure may extend in the second direction, and a plurality of third structures may be formed to be spaced apart from each other in the first direction. Also, the fourth structure may extend in the second direction, and a plurality of fourth structures may be formed to be spaced apart from each other in the first direction.

Figure 20:
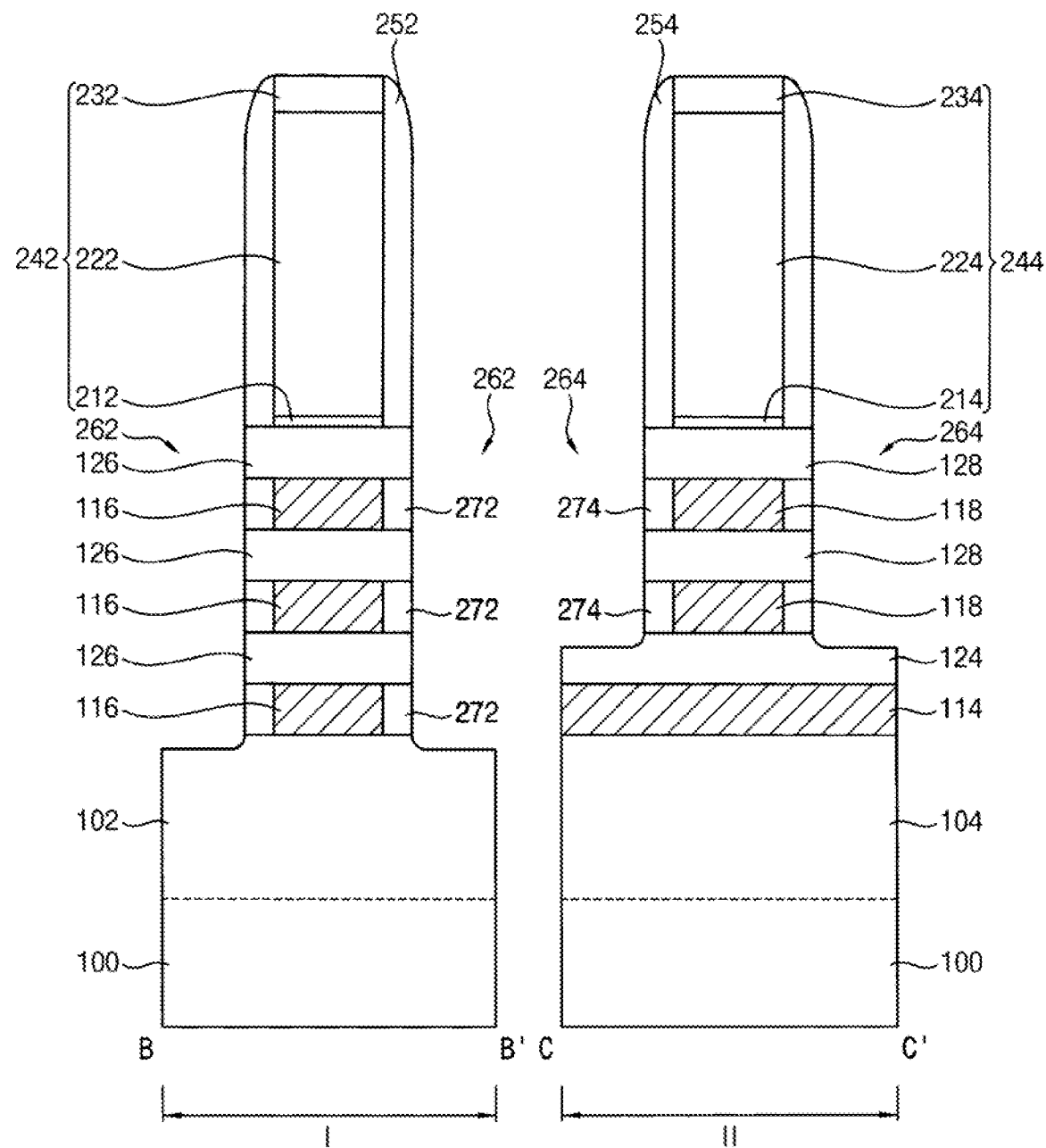

Referring to FIG. 20, after etching opposite sidewalls of the first and second sacrificial patterns 116 and 118 exposed by the first and second openings 262 and 264 to form first and second recesses, respectively, first and second inner spacers 272 and 274 may be formed to fill the first and second recesses, respectively.

In an example embodiment of the present inventive concept, the first and second recesses may be formed by performing a wet etching process on the first and second sacrificial patterns 116 and 118.

In an example embodiment of the present inventive concept, a second spacer layer may be conformally formed on the first and second dummy gate structures 242 and 244, the first and second outer spacers 252 and 254, the first fin structure and the upper portion of the second fin structure, the first active pattern 102, the lowermost one of the second semiconductor lines 124 included in the second fin structure, and the first and second isolation patterns 162 and 164 to fill the first and second recesses, and may be anisotropically etched to form the first and second inner spacers 272 and 274. The second spacer layer may be formed by a CVD process, an ALD process, or the like.

The first inner spacer 272 may be formed to cover each of opposite sidewalls in the first direction of each of the first sacrificial patterns 116 included in the first fin structure, and the second inner spacer 274 may be formed to cover each of opposite sidewalls in the first direction of each of the second sacrificial patterns 118 included in the upper portion of the second fin structure, that is, each of the opposite sidewalls in the first direction of each of the second sacrificial patterns 118 at two upper levels except for the lowermost level.

Figure 21:
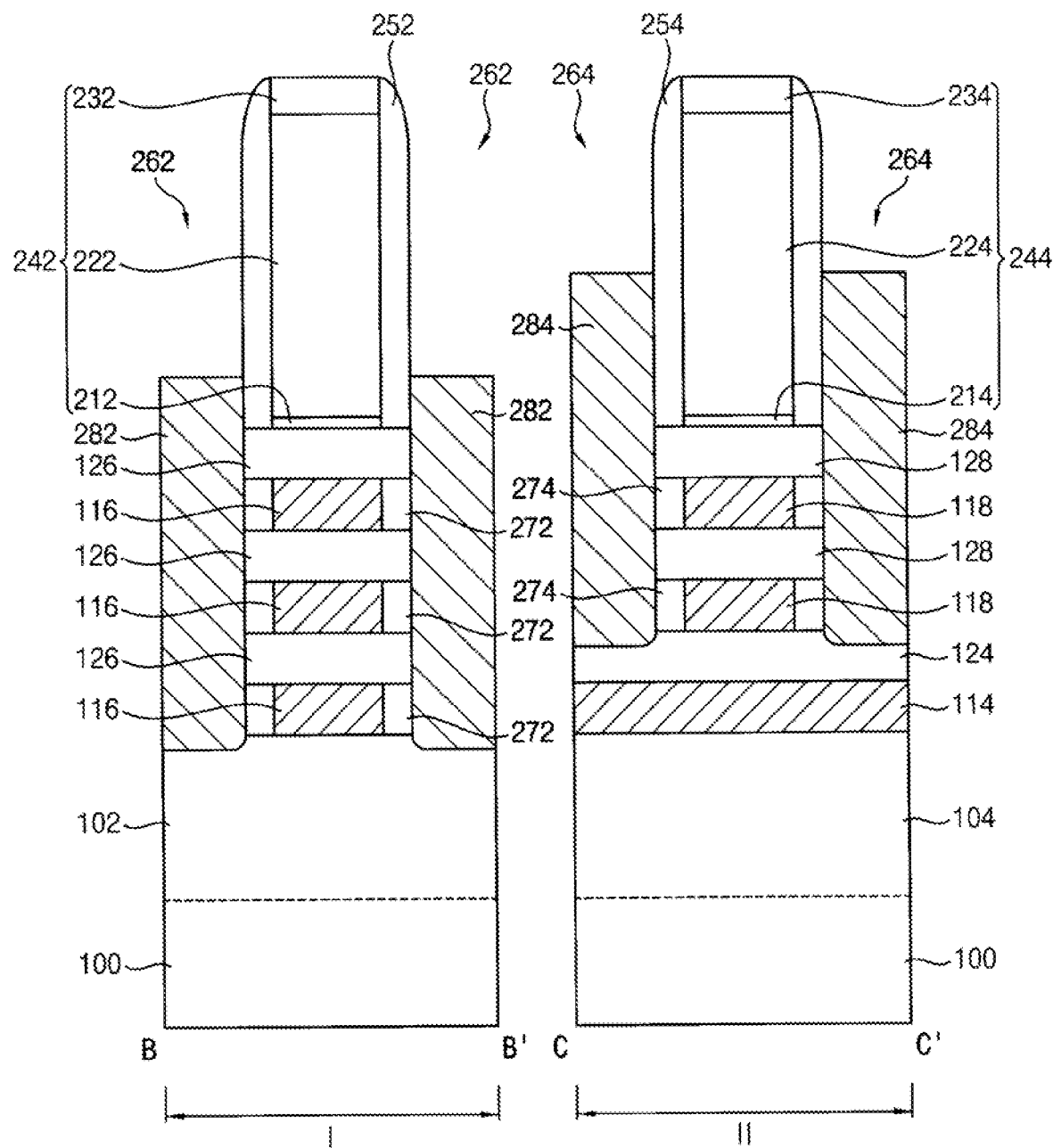

Referring to FIG. 21, a first source/drain layer 282 may be formed on the upper surface of the first active pattern 102 exposed by the first opening 262, and a second source/drain layer 284 may be formed on the upper surface of the second semiconductor line 124 exposed by the second opening 264.

In an example embodiment of the present inventive concept, the first and second source/drain layers 282 and 284 may be formed by performing a selective epitaxial growth (SEG) process using the upper surfaces of the first active pattern 102 and the second semiconductor line 124 exposed by the first and second openings 262 and 264, respectively, as a seed.

In an example embodiment of the present inventive concept, the SEG process may be performed using a silicon source gas, e.g., disilane ($Si_2H_6$) gas, and using a carbon source gas, e.g., methylsilane ($SiH_3CH_3$), and thus a single crystalline silicon carbide (SiC) layer may be formed. On the other hand, the SEG process may be performed using only a silicon source gas, e.g., disilane ($Si_2H_6$) gas, and thus a single crystalline silicon (Si) layer may be formed. In this case, the first and second source/drain layers 282 and 284 may serve as a source/drain of an NMOS transistor.

In an example embodiment of the present inventive concept, the SEG process may be performed using a silicon source gas, e.g., dichlorosilane ($SiH_2Cl_2$) gas, and a germanium source gas, e.g., germanium tetrahydride ($GeH_4$), and thus a single crystalline silicon-germanium (SiGe) layer may be formed. In this case, the first and second source/drain layers 282 and 284 may serve as a source/drain of a PMOS transistor.

In an example embodiment of the present inventive concept, the first and second source/drain layers 282 and 284 may be formed at opposite sides in the first direction of the third and fourth structures, respectively. In an example embodiment of the present inventive concept, the first source/drain layer 282 may contact outer sidewalk of the first inner spacer 272 covering sidewalls of the first sacrificial patterns 116, and sidewalls of the first semiconductor patterns 126 included in the first fin structure, and may be further grown in the third direction to contact an outer sidewall of the first outer spacer 252. Also, the second source/drain layer 284 may contact sidewalk of the second semiconductor patterns 128 included in the second fin structure, and outer sidewalls of the second inner spacer 274 covering sidewalls of the second sacrificial patterns 118, and may be further grown in the third direction to contact an outer sidewall of the second outer spacer 254.

Impurity doping and a heat treatment may be further performed on the first and second source/drain layers 282 and 284 so that each of the first and second source/drain layers may serve as a source/drain of the transistor. For example, when each of the first and second source/drain layers 282 and 284 is formed to include silicon carbide (SiC) or silicon (Si), an N-type impurity doping and a heat treatment may be performed so that each of the first and second source/drain layers 282 and 284 may serve as a source/drain of an NMOS transistor. When each of the first and second source/drain layers 282 and 284 is formed to include silicon-germanium (SiGe), a P-type impurity doping and a heat treatment may be performed so that each of the first and second source/drain layers 282 and 284 may serve as a source/drain of a PMOS transistor.

In an example embodiment of the present inventive concept, an upper surface of the second semiconductor line 124 on the second region II of the substrate 100 may be higher than an upper surface of the first active pattern 102 on the first region I of the substrate 100, and since the first and second source/drain layers 282 and 284 may be formed by the same SEG process using each of the upper surfaces thereof as a seed, an upper surface of the second source/drain layer 284 may be higher than an upper surface of the first source/drain layer 282. Also, a lower surface of the second source/drain layer 284 may be higher than a lower surface of the first source/drain layer 282.

Figure 22:
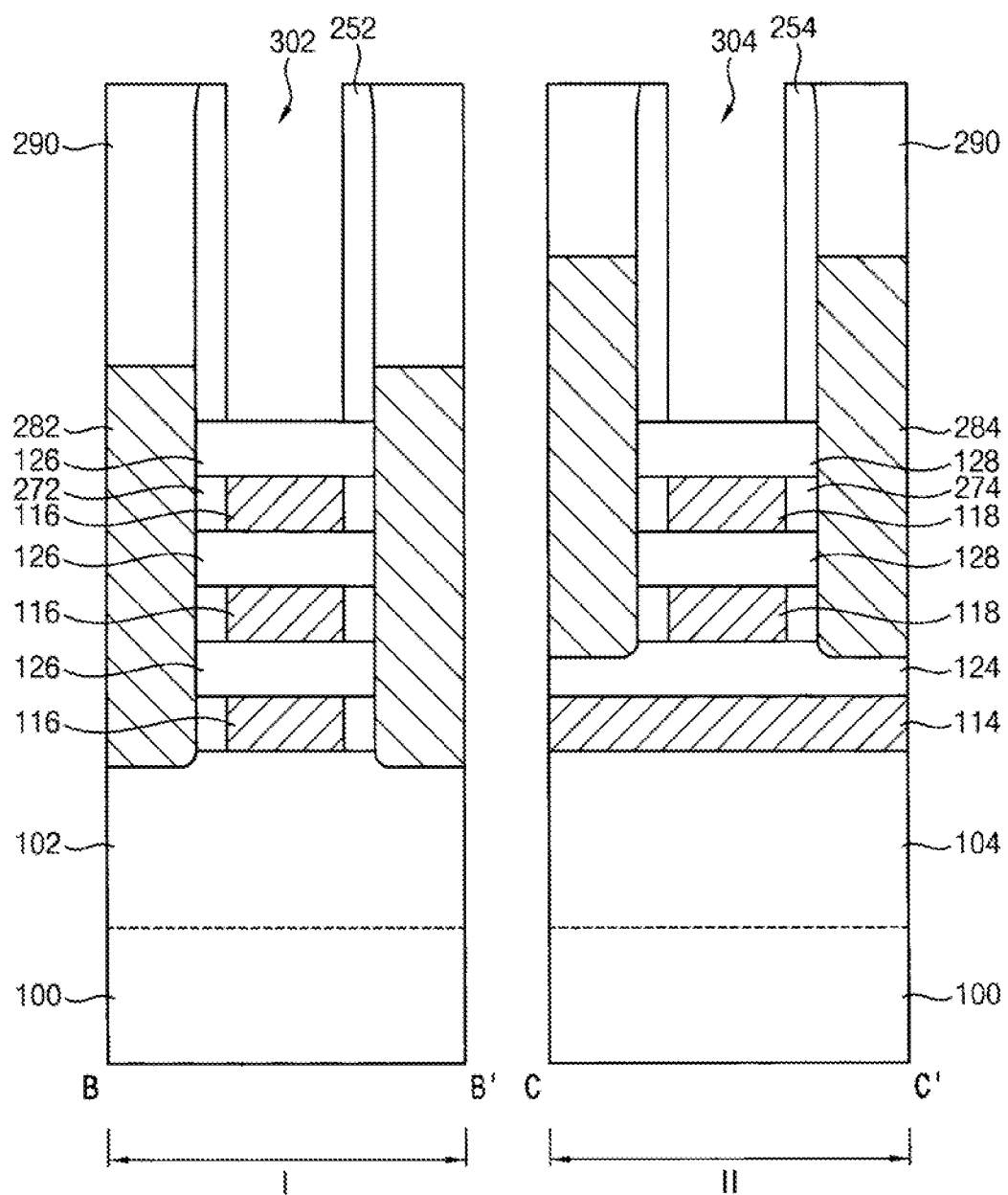

Referring to FIG. 22, after forming an insulation layer 290 on the substrate 100 over the first and second isolation patterns 162 and 164 to cover the third and fourth structures and the first and second source/drain layers 282 and 284, the insulation layer 290 may be planarized until upper surfaces of the first and second dummy gate electrodes 222 and 224 included in the third and fourth structures, respectively, are exposed. During the planarization process, the first and second dummy gate masks 232 and 234 may also be removed, and upper portions of the first and second outer spacers 252 and 254 may also be partially removed.

The planarization process may be performed by a CMP process and/or an etch back process.

After the planarization process, the exposed first and second dummy gate electrodes 222 and 224 and the first and second dummy gate insulation patterns 212 and 214 thereunder may be removed to form third and fourth openings 302 and 304, respectively, exposing inner sidewalls of the first and second outer spacers 252 and 254 and upper surfaces of the uppermost ones of the first and second semiconductor patterns 126 and 128, respectively. The first and second dummy gate electrodes 222 and 224 may be removed by, e.g., a wet etching process. The first and second dummy gate insulation patterns 212 and 214 may also be removed by, e.g., a wet etching process. An etchant used in etching the first and second dummy gate electrodes 222 and 224 may be different from an etchant used in etching the first and second dummy gate insulation patterns 212 and 214.

Figure 23:
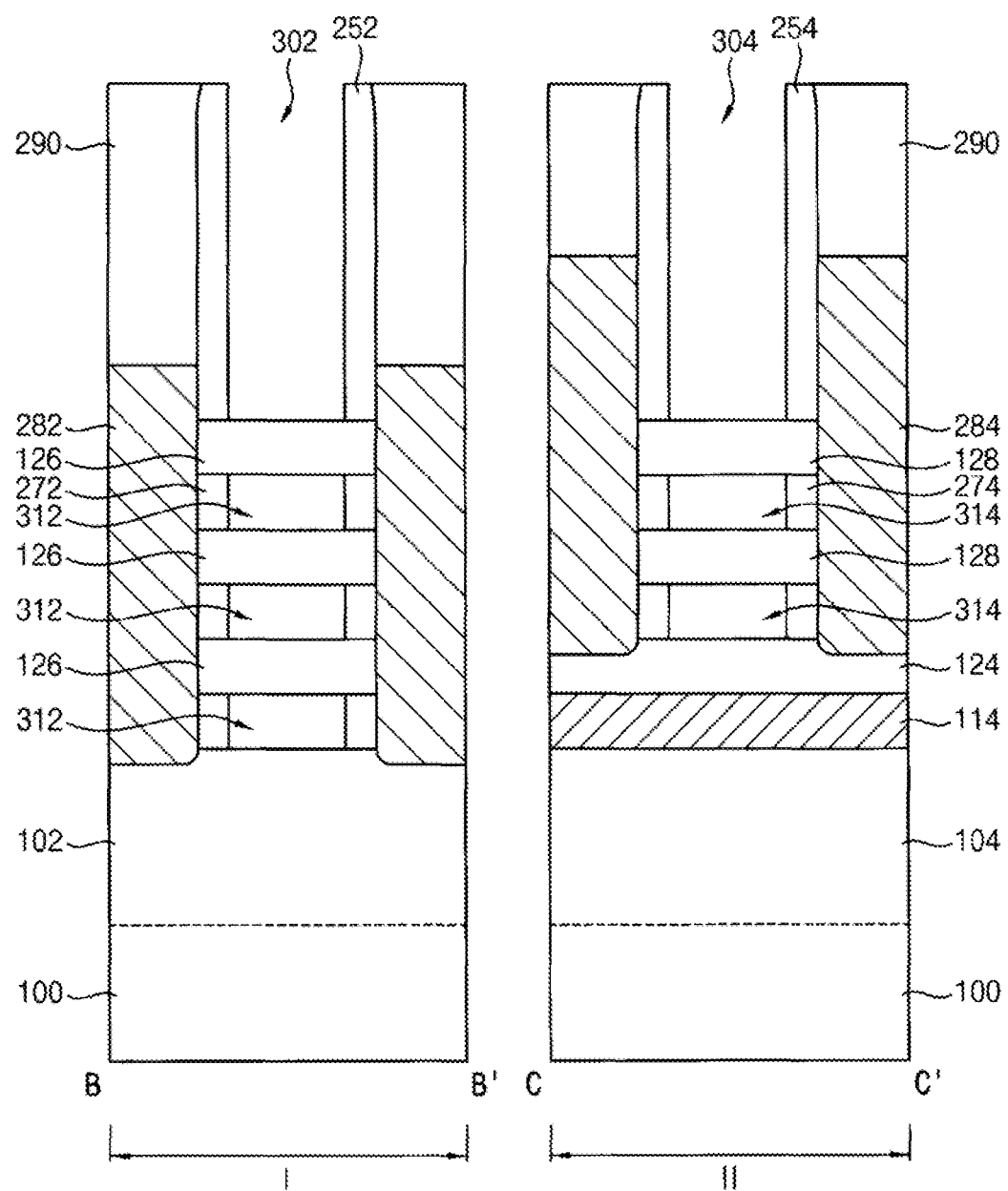
Figure 24:
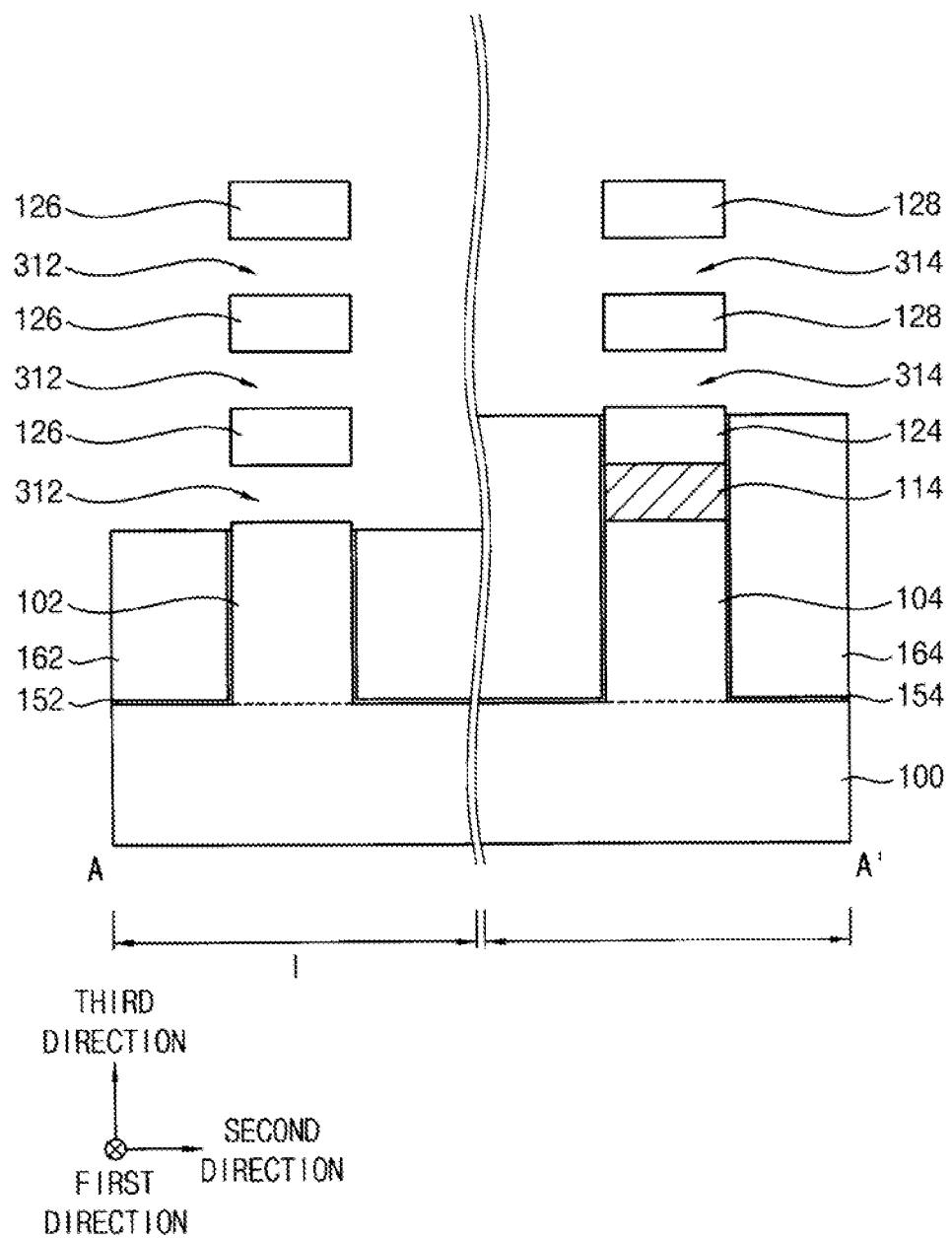

Referring to FIGS. 23 and 24, the first sacrificial patterns 116 may be removed to form a fifth opening 312 exposing inner sidewalls of the first inner spacers 272, surfaces of the first semiconductor patterns 126 and an upper surface of the first active pattern 102, and the second sacrificial patterns 118 may be removed to form a sixth opening 314 exposing inner sidewalls of the second inner spacers 274, surfaces of the second semiconductor patterns 128 and an upper surface of the second semiconductor line 124.

During the removal of the first and second sacrificial patterns 116 and 118, the second sacrificial line 114 under the second semiconductor line 124 may be protected not only by the second isolation pattern 164 but also by the second liner 154. For example, without the second liner 154 formed along with the second isolation pattern 164, when removing the first and second dummy gate structures 242 and 244, the second isolation pattern 164 may be partially removed so that the second sacrificial line 114 buried in the second isolation pattern 164 may be exposed and the exposed second sacrificial line 114 may be etched. However, this may be prevented by the second liner 154 which remains on the sidewall of the second sacrificial line 114 to prevent the second sacrificial line 114 from being etched when the second isolation pattern 164 is partially removed. For example, the second liner 154 may protect the second sacrificial line 114 in the case that the second isolation pattern 164 is partially removed.

Referring again FIGS. 1 to 3, a first gate structure 362 may be formed on the first region I of the substrate 100 to fill the third and fifth openings 302 and 312, and a second gate structure 364 may be formed on the second region II of the substrate 100 to fill the fourth and sixth openings 304 and 314.

After performing a thermal oxidation process on the upper surface of the first active pattern 102, the upper surface of the second semiconductor line 124, and the surfaces of the first and second semiconductor patterns 126 and 128 exposed by the third to sixth openings 302, 304, 312 and 314 to form first and second interface patterns 322 and 324, respectively, a gate insulation layer and a work function control layer may be conformally formed on surfaces of the first and second interface patterns 322 and 324, inner sidewalls of the first and second inner spacers 272 and 274, inner sidewalls of the first and second outer spacers 252 and 254 and an upper surface of the insulation layer 290, and a gate electrode layer may be formed to sufficiently fill remaining portions of the third to sixth openings 302, 304, 312 and 314.

The gate insulation layer, the work function control layer, and the gate electrode layer may be formed by a CVD process, an ALD process, a PVD process, or the like, in an example embodiment of the present inventive concept, the first and second interface patterns 322 and 324 may be formed by a CVD process, an ALD process, etc., instead of the thermal oxidation process, and in this case, the first and second interface patterns 322 and 324 may also be formed on the inner sidewalls of the first and second inner spacers 272 and 274 and the inner sidewalk of the first and second outer spacers 252 and 254.

The gate electrode layer, the work function control layer, and the gate insulation layer may be planarized until the upper surface of the insulation layer 290 is exposed to form the first and second gate electrodes 352 and 354, the first and second work function control patterns 342 and 344, and the first and second gate insulation patterns 332 and 334. The first interface pattern 322, the first gate insulation pattern 332, the first work function control pattern 342, and the first gate electrode 352 altogether may form the first gate structure 362, and the second interface pattern 324, the second gate insulation pattern 334, the second work function control pattern 344, and the second gate electrode 354 altogether may form the second gate structure 364.

The first semiconductor patterns 126 at a plurality of levels, respectively, spaced apart from each other in the third direction, the first gate structure 362 at least partially covering the first semiconductor patterns 126 and extending in the second direction, and the first source/drain layer 282 on each of the opposite sidewalls in the first direction of the first gate structure 362 on the first region I of the substrate 100 may form a first MBCFET. Also, the second semiconductor patterns 128 at a plurality of levels, respectively, spaced apart from each other in the third direction, the second gate structure 364 at least partially covering the second semiconductor patterns 128 and extending in the second direction, and the second source/drain layer 284 on each of the opposite sidewalk in the first direction of the second gate structure 364 on the second region II of the substrate 100 may form a second MBCFET.

In an example embodiment of the present inventive concept, the number of the channels included in the first MBCFET may be greater than the number of the channels included in the second MBCFET. For example, the second liner 154 and the second isolation pattern 164 covering sidewalls of the second fin structure may be etched less than the first liner 152 and the first isolation pattern 162, so that lower ones of the second sacrificial lines 114 in the second fin structure may not be exposed, and thus the non-exposed ones of the second semiconductor line 124 may not be used as a channel. In this way, MBCFETs including different numbers of channels may be easily formed. Accordingly, the present inventive concept may provide a method of manufacturing a plurality of MBCFETS having different numbers of stacks in one device.

Figure 25:
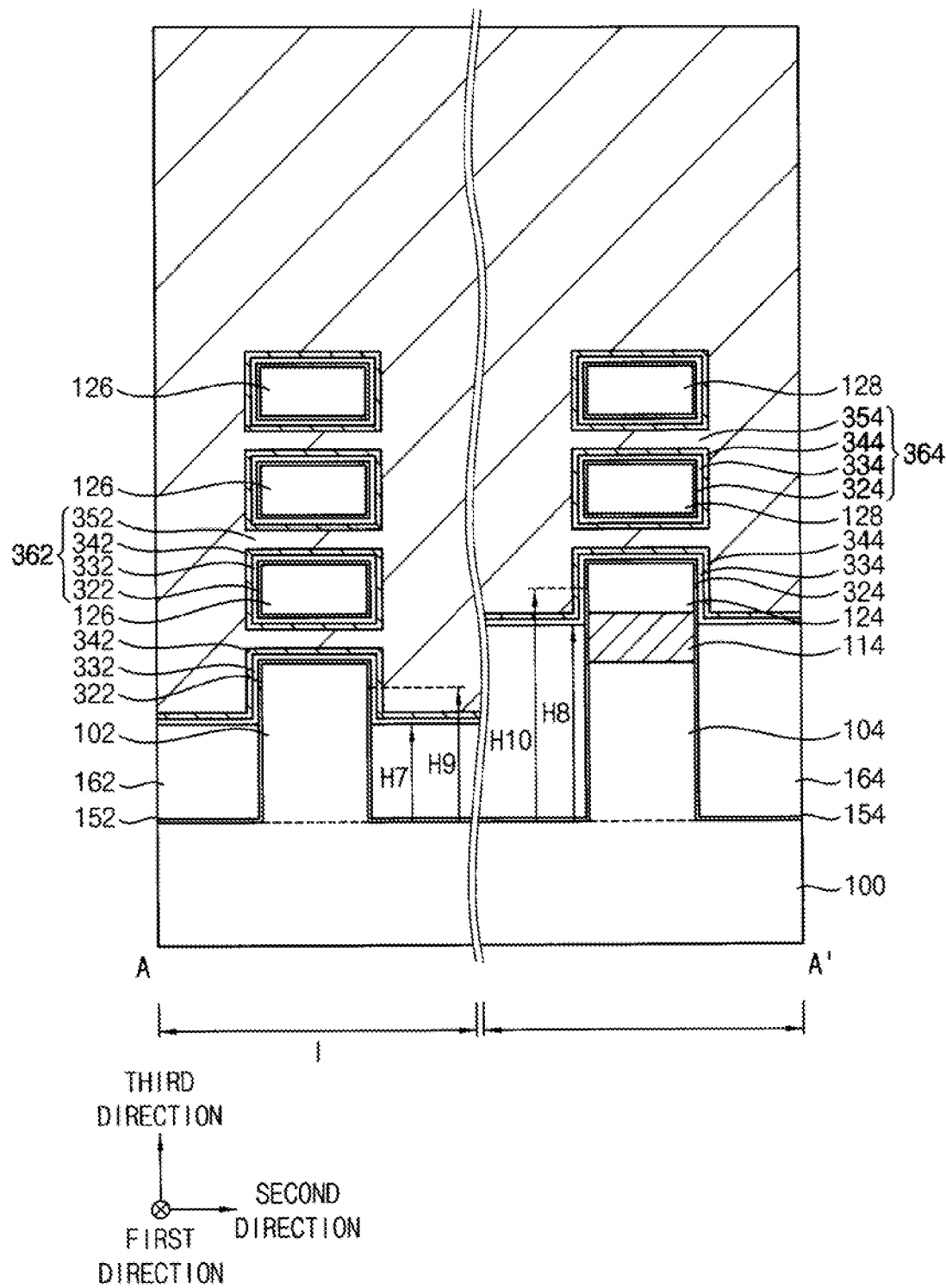
FIG. 25 is a cross-sectional view illustrating a semiconductor device in accordance with an example embodiment of the present inventive concept.

FIG. 25 is a cross-sectional view illustrating a semiconductor device in accordance with an example embodiment of the present inventive concept. The semiconductor device illustrated in FIG. 25 is substantially the same as or similar to the semiconductor device illustrated in FIGS. 1 to 3, except for the heights of upper surfaces of the liner and the isolation pattern. Accordingly, like reference numerals refer to like elements, and detailed descriptions thereon are omitted herein.

Referring to FIG. 25, upper surfaces of the first and second isolation patterns 162 and 164 may have seventh and eighth heights H7 and H8, respectively, and the seventh and eighth heights H7 and H8 may be lower than the first and second heights H1 and H2 of the upper surfaces of the first and second isolation patterns 162 and 164, respectively, illustrated in FIGS. 1 to 3.

The first isolation pattern 162 may not surround an upper sidewall of the first active pattern 102, and an uppermost surface of the first liner 152 may have a ninth height H9 greater than the seventh height H7 of the upper surface of the first isolation pattern 162, however, smaller than the first height H1 of the uppermost surface of the first liner 152 illustrated FIGS. 1 to 3.

The second isolation pattern 164 may not surround an upper sidewall of the second sacrificial line 114 and the sidewall of the second semiconductor line 124, and an uppermost surface of the second liner 154 may have a tenth height H10 greater than the eight height H8 of the upper surface of the second isolation pattern 164, however, smaller than the second height H2 of the uppermost surface of the second liner 154 illustrated in FIGS. 1 to 3. However, in an example embodiment of the present inventive concept, the tenth height H10 of the uppermost surface of the second liner 154 may be at least greater than a height of an upper surface of the second sacrificial line 114, and thus a sidewall of the second sacrificial line 114 may be covered and protected by the second liner 154.

Figure 26:
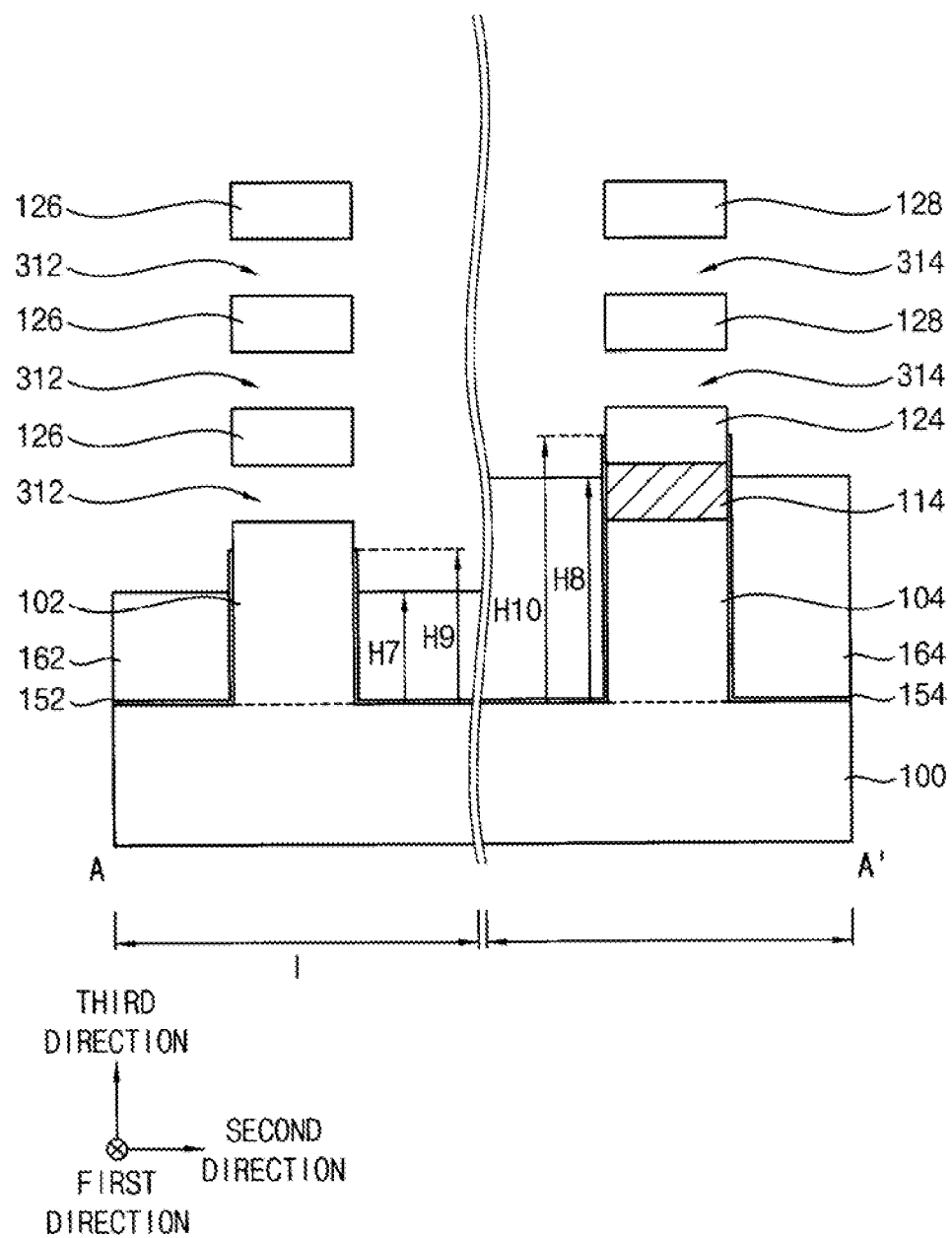
FIG. 26 is a cross-sectional view illustrating a stage of a method of manufacturing a semiconductor device in accordance with an example embodiment of the present inventive concept.

FIG. 26 is a cross-sectional view illustrating a stage of a method of manufacturing a semiconductor device in accordance with an example embodiment of the present inventive concept. This method of manufacturing a semiconductor device includes processes substantially the same as or similar to the processes illustrated in FIGS. 4 to 24 and FIGS. 1 to 3, and thus detailed descriptions thereon are omitted herein.

Referring to FIG. 26, processes substantially the same as or similar to the processes illustrated in FIGS. 4 to 24 may be performed.

When the fifth and sixth openings 312 and 314 are formed by removing the first and second sacrificial patterns 116 and 118, upper portions of the first and second isolation patterns 162 and 164 thereunder may also be removed, and thus upper surfaces of the first and second isolation patterns 162 and 164 may have seventh and eight heights H7 and H8, respectively, smaller than the original first and second heights H1 and H2, respectively.

The first and second liners 152 and 154 may also be partially removed, however, an amount of the removed portions thereof may be less than that of the removed portions of the first and second isolation patterns 162 and 164, and at least the second liner 154 may have an upper surface higher than the upper surface of the second sacrificial line 114. Accordingly, the second sacrificial line 114 may not be exposed to the outside, and may not be removed together with the first and second sacrificial patterns 116 and 118. In this case, since the upper surface of second isolation pattern 164 is lower than the upper surface of the second sacrificial line 114, during the removal of the first and second sacrificial patterns 116 and 118, the second sacrificial line 114 under the second semiconductor line 124 may not be protected by the second isolation pattern 164. However, since the upper surface of the second liner 154 is higher than the upper surface of the second sacrificial line 114, during the removal of the first and second sacrificial patterns 116 and 118, the second sacrificial line 114 under the second semiconductor line 124 may be protected by the second liner 154 covering the sidewalls of the second sacrificial line 114. Thus, the second sacrificial line 114 may remain under the second semiconductor line 124, and may be disposed at a height corresponding to a height (i.e., at substantially the same height) of a portion of the first gate structure 362 under the lowermost one of the first semiconductor patterns 126 (i.e., the first channels).

Processes substantially the same as or similar to the processes illustrated in FIGS. 1 to 3 may be performed to complete the fabrication of the semiconductor device.

Figure 27:
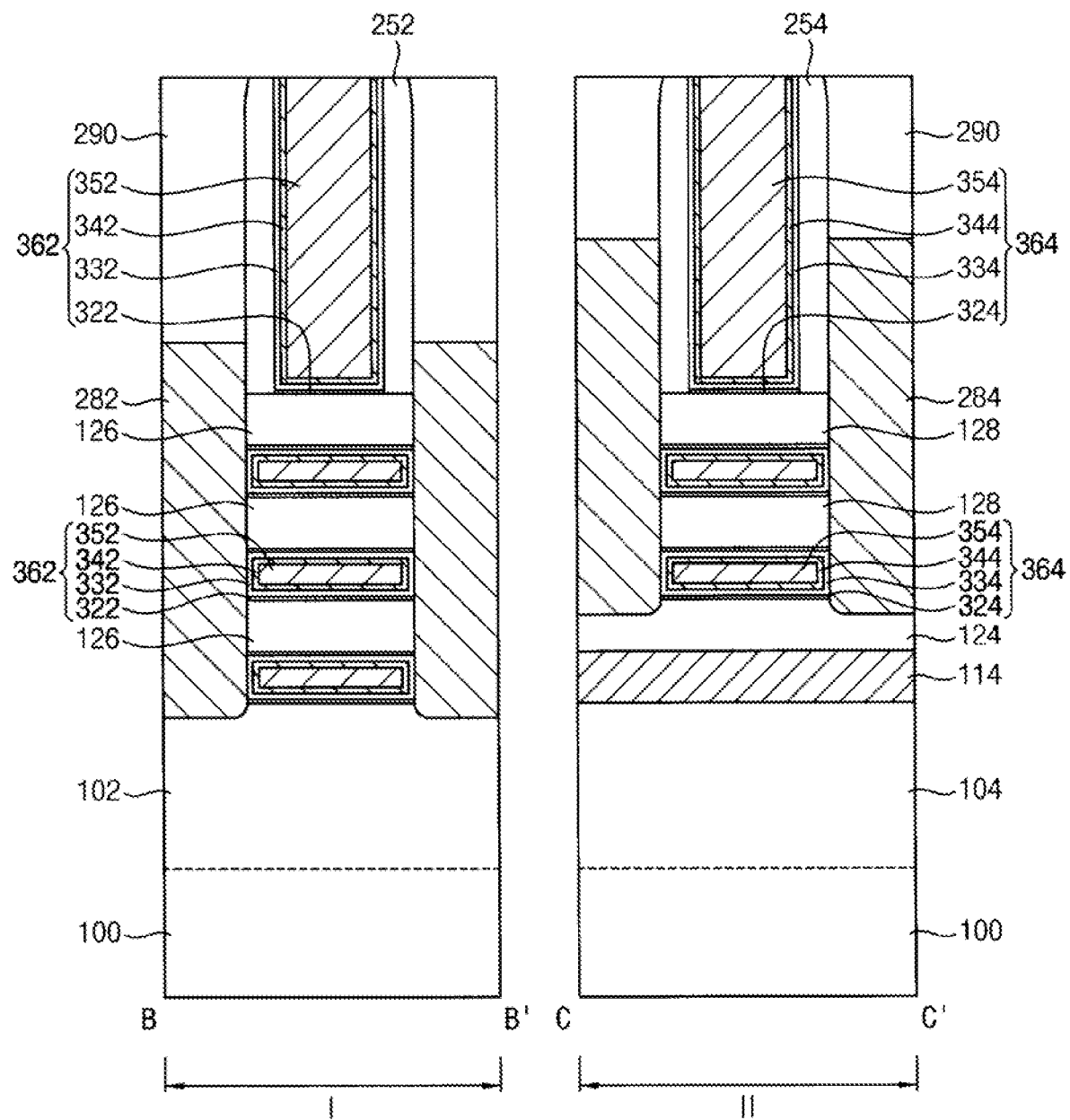
FIG. 27 is a cross-sectional view illustrating a semiconductor device in accordance with an example embodiment of the present inventive concept.

FIG. 27 is a cross-sectional view illustrating a semiconductor device in accordance with an example embodiment of the present inventive concept. This semiconductor device is substantially the same as or similar to the semiconductor device illustrated in FIGS. 1 to 3, except for not including the first and second inner spacers.

When the SEG process for forming the first and second source/drain layers 282 and 284 is performed, together with the first active pattern 102 and the second semiconductor line 124 thereunder, not only the first and second semiconductor patterns 126 and 128, but also the first and second sacrificial patterns 116 and 118 (see FIG. 21) may also be used as a seed, and thus the first and second source/drain layers 282 and 284 may have good crystallinity.

In an example embodiment of the present inventive concept, the first and second source/drain layers 282 and 284 may include P-type impurities, and thus may serve as a source/drain of a PMOS transistor.

As described above, although the present inventive concept has been described with reference to specific example embodiments, those skilled in the art will readily appreciate that many modifications are possible in the example embodiments without departing from the spirit and scope of the present inventive concept as defined by the appended claims.

What is claimed is:

1. A semiconductor device, comprising:
a substrate including a first region and a second region adjacent to or spaced apart from the first region;
first channels disposed on the first region of the substrate, the first channels being spaced apart from each other in a vertical direction substantially perpendicular to an upper surface of the substrate;
second channels disposed on the second region of the substrate, the second channels being spaced apart from each other in the vertical direction;
a first gate structure disposed on the first region of the substrate, the first gate structure covering at least a portion of a surface of each of the first channels;
a second gate structure disposed on the second region of the substrate, the second gate structure covering at least a portion of a surface of each of the second channels;
a first source/drain layer disposed at each of opposite sides of the first gate structure in a first direction substantially parallel to the upper surface of the substrate, the first source/drain layer being connected to the first channels; and
a second source/drain layer disposed at each of opposite sides of the second gate structure in the first direction, the second source/drain layer being connected to the second channels,
wherein the second channels are disposed at heights substantially the same as those of corresponding ones of the first channels, and a height of a lowermost one of the second channels is greater than a height of a lowermost one of the first channels, and
wherein a height of a lower surface of the second source/drain layer is greater than a height of a lower surface of the first source/drain layer.

2. The semiconductor device of claim 1, wherein a height of an uppermost one of the second channels is substantially the same as that of an uppermost one of the first channels.

3. The semiconductor device of claim 1, wherein a total number of the second channels is smaller than a total number of the first channels by a total number of the first channels at heights smaller than the height of the lowermost one the second channels.

4. The semiconductor device of claim 1, wherein a height of an upper surface of the second source/drain layer is greater than a height of an upper surface of the first source/drain layer.

5. The semiconductor device of claim 1, wherein
the first and second channels include silicon, and
the semiconductor device further comprises:
a semiconductor line including silicon, the semiconductor line being under the second channels on the second region of the substrate at a height corresponding to that of the lowermost one of the first channels.

6. The semiconductor device of claim 5, wherein
the semiconductor line extends in a first direction substantially parallel to the upper surface of the substrate, and
the second channels are overlapped with the semiconductor line in the vertical direction.

7. The semiconductor device of claim 6, further comprising:
a sacrificial line including silicon-germanium, the sacrificial line being under the semiconductor line at a height corresponding to a height of a portion of the first gate structure under the lowermost one of the first channels.

8. The semiconductor device of claim 1, wherein
the first gate structure is formed on a first active pattern and a first isolation pattern covering a sidewall of the first active pattern, the first active pattern protruding from an upper surface of the first region of the substrate in the vertical direction and extending in a first direction substantially parallel to the upper surface of the substrate, and the second gate structure is formed on a sacrificial line and a semiconductor line sequentially stacked on a second active pattern and a second isolation pattern, the second active pattern protruding from an upper surface of the second region of the substrate in the vertical direction and extending in the first direction, and the second isolation pattern covering sidewalls of the second active pattern, the sacrificial line and the semiconductor line.

9. The semiconductor device of claim 8, further comprising:
a first liner covering the upper surface of the first region of the substrate and the sidewall of the first active pattern; and
a second liner covering the upper surface of the second region of the substrate, and the sidewalls of the second active pattern, the sacrificial line and the semiconductor line.

10. The semiconductor device of claim 9, wherein a height of an uppermost surface of the second liner is greater than a height of an uppermost surface of the first liner.

11. The semiconductor device of claim 9, wherein the first and second liners include a nitride, and the first and second isolation patterns include an oxide.

12. The semiconductor device of claim 8, wherein
upper surfaces of the first and second active patterns are formed at substantially a same height, and
an upper surface of the second isolation pattern is higher than an upper surface of the first isolation pattern.

13. The semiconductor device of claim 8, wherein each of the first and second gate structures extends in a second direction substantially parallel to the upper surface of the substrate and intersecting with the first direction.

14. A semiconductor device, comprising:
a substrate including a first region and a second region adjacent to or spaced apart from the first region;
a first transistor including:
a first gate structure disposed on the first region of the substrate; and
first channels spaced apart from each other in a vertical direction substantially perpendicular to an upper surface of the substrate, each of the first channels partially extending through the first gate structure; and
a second transistor including:
a second gate structure disposed on the second region of the substrate;
second channels spaced apart from each other in the vertical direction, each of the second channels partially extending through the second gate structure;
a first source/drain layer disposed at each of opposite sides of the first gate structure in a first direction substantially parallel to the upper surface of the substrate, the first source/drain layer being connected to the first channels; and
a second source/drain layer disposed at each of opposite sides of the second gate structure in the first direction, the second source/drain layer being connected to the second channels,
wherein a total number of the first channels is greater than a total number of the second channels, and an uppermost one of the first channels and an uppermost one of the second channels are formed at substantially a same height, and
wherein a height of a lower surface of the second source/drain layer is greater than a height of a lower surface of the first source/drain layer.

15. The semiconductor device of claim 14, wherein a lowermost one of the first channels is formed at a height smaller than that of a lowermost one of the second channels.

16. The semiconductor device of claim 14, further comprising:
a first active pattern protruding from an upper surface of the first region of the substrate in the vertical direction; and
a second active pattern protruding from an upper surface of the second region of the substrate in the vertical direction.

17. A semiconductor device, comprising:
a substrate including a first region and a second region adjacent to or spaced apart from the first region;
a first active pattern protruding upwardly from the first region of the substrate;
a first isolation pattern surrounding a sidewall of the first active pattern;
a first transistor including:
a first gate structure disposed on the first active pattern and the first isolation pattern; and
first channels spaced apart from each other in a vertical direction substantially perpendicular to an upper surface of the substrate, each of the first channels partially extending through the first gate structure;
a second active pattern protruding upwardly from the second region of the substrate;
a sacrificial line and a semiconductor line sequentially stacked on the second active pattern;
a second isolation pattern surrounding sidewalls of the second active pattern, the sacrificial line and the semiconductor line; and
a second transistor including:
a second gate structure disposed on the semiconductor line and the second isolation pattern; and
second channels spaced apart from each other in the vertical direction, each of the second channels partially extending through the second gate structure.

18. The semiconductor device of claim 17, wherein
a total number of the first channels is greater than a total number of the second channels, and
the second channels are formed at heights substantially the same as those of corresponding ones of the first channels, respectively.

19. The semiconductor device of claim 17, further comprising:
a first liner covering the sidewall of the first active pattern; and
a second liner covering the sidewalls of the second active pattern, the sacrificial line and the semiconductor line,
wherein a height of an uppermost surface of the second liner is greater than a height of an uppermost surface of the first liner.

* * * * *